US006985811B2

(12) United States Patent
Gronemeyer

(10) Patent No.: US 6,985,811 B2
(45) Date of Patent: Jan. 10, 2006

(54) METHOD AND APPARATUS FOR REAL TIME CLOCK (RTC) BROWNOUT DETECTION

(75) Inventor: Steven A. Gronemeyer, Cedar Rapids, IA (US)

(73) Assignee: SIRF Technology, Inc., San Jose, CA (US)

(*) Notice: Subject to any disclaimer, the term of this patent is extended or adjusted under 35 U.S.C. 154(b) by 0 days.

(21) Appl. No.: 10/600,174

(22) Filed: Jun. 20, 2003

(65) Prior Publication Data

US 2004/0225439 A1 Nov. 11, 2004

Related U.S. Application Data

(63) Continuation-in-part of application No. 10/021,119, filed on Oct. 30, 2001, now Pat. No. 6,662,107.

(51) Int. Cl.
*G01S 5/02* (2006.01)

(52) U.S. Cl. .................... 701/213; 340/988; 340/990; 342/357.06; 342/357.15; 342/457; 375/136

(58) Field of Classification Search .............. 375/324, 375/149, 152, 140, 150, 343, 136, 1; 368/47; 701/213, 214, 226, 215, 216; 342/357.06, 342/357.15, 357.12, 357, 358, 457; 340/990, 340/995, 988; 455/12.1
See application file for complete search history.

(56) References Cited

U.S. PATENT DOCUMENTS 5,398,263 A * 3/1995 Vanderspool et al. ....... 375/376
5,592,173 A    1/1997 Lau et al.
5,594,453 A    1/1997 Rodal et al.
5,629,708 A    5/1997 Rodal et al.
5,654,718 A    8/1997 Beason et al.
5,864,315 A    1/1999 Welles et al.
5,893,044 A    4/1999 King et al.
5,940,027 A    8/1999 Forseth et al.
5,982,322 A *  11/1999 Bickley et al. ........ 342/357.08
6,225,945 B1 * 5/2001 Loomis ................. 342/357.12
6,297,771 B1   10/2001 Gronemeyer
6,373,429 B1 * 4/2002 Eschenbach ........... 342/357.03
2001/0019316 A1 * 9/2001 Hasegawa .............. 342/357.12
2002/0136094 A1 * 9/2002 Kawai ......................... 368/47
2003/0016166 A1 * 1/2003 Jandrell .................... 342/357.1

FOREIGN PATENT DOCUMENTS

JP           09005419 A   *  1/1997
JP           09281209 A   *  10/1997
JP         2000075070 A   *  3/2000

* cited by examiner

*Primary Examiner*—Thomas G. Black
*Assistant Examiner*—Tuan C To

(57) ABSTRACT

A method and apparatus for real time clock brownout detection. A low power real time clock (RTC) operates continuously to keep time in a global positioning system (GPS) receiver while some receiver components are powered down. In various embodiments, a brownout detector circuit detects a loss of RTC clock cycles. If a loss of RTC clock cycles exceeds a predetermined threshold such that the RTC is not reliable for GPS navigation, an RTC status signal so indicates.

28 Claims, 9 Drawing Sheets

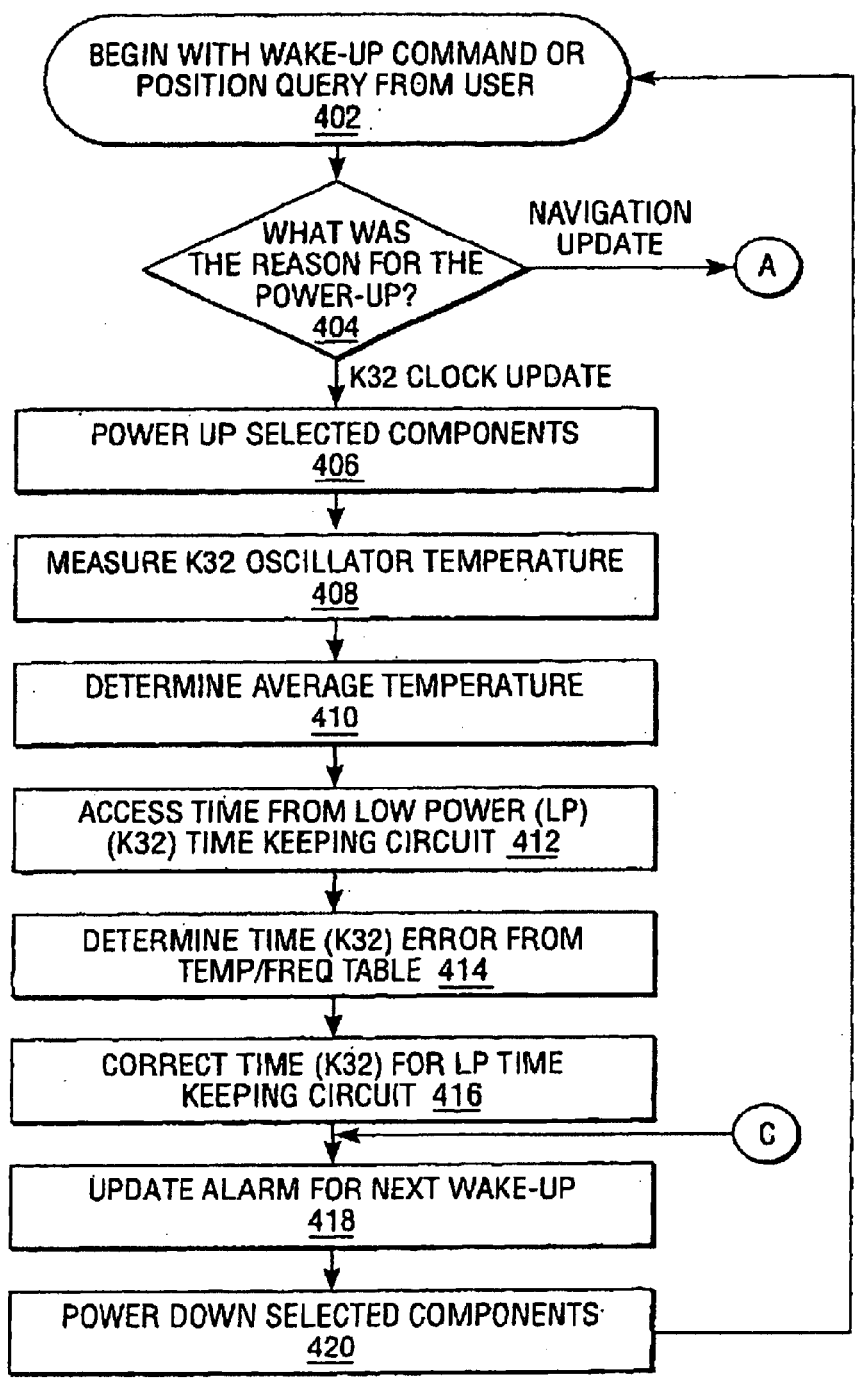

METHOD AND APPARATUS FOR REAL TIME CLOCK (RTC) BROWNOUT DETECTION

RELATED APPLICATIONS

This application is a continuation-in-part of U.S. patent application Ser. No. 10/021,119, entitled "Calibrated Real Time Clock for Acquisition of GPS Signals During Low Operation", filed Oct. 30, 2001, now U.S. Pat. No. 6,662,107, which is hereby incorporated by reference.

FIELD OF THE INVENTION

This invention is generally related to Global Positioning System (GPS) receivers. More particularly, it is related to accurately detecting when a real time clock has become inaccurate due to power brownout.

BACKGROUND

The Global Positioning system (GPS) is a collection of twenty-four earth-orbiting satellites. Each of the GPS satellites travels in a precise orbit about 11,000 miles above the earth's surface. A GPS receiver locks onto at least three of the satellites to determine its precise location. Each satellite transmits a signal modulated with a unique pseudo-noise (PN) code. Each PN code is a sequence of 1023 chips that are repeated every ms consistent with a chip rate of 1.023 megahertz (MHz). Each satellite transmits at the same frequency. For civil applications, the frequency is known as L1 and is 1575.42 MHz. The GPS receiver receives a signal that is a mixture of the transmissions of the satellites that are visible to the receiver. The receiver detects the transmission of a particular satellite by correlating the received signal with shifted versions of the PN code for the satellite. If the level of correlation is sufficiently high so that there is a peak in the level of correlation achieved for a particular shift and PN code, the receiver detects the transmission of the satellite corresponding to the particular PN code. The receiver then uses the shifted PN code to achieve synchronization with subsequent transmissions for the satellite.

GPS employs a unique time keeping system. GPS time is kept in terms of seconds and weeks since Jan. 6, 1980. There are 604,800 seconds per week. Therefore, GPS time is stated in terms of a time of week (TOW) and a week number. TOW ranges from 0 to 604800, corresponding to the number of seconds in a week. The week number started with week zero on Jan. 6, 1980 and is currently in excess of one thousand weeks. The TOW can have a fractional part, particularly when oscillators provide a resolution of $1/32,768^{th}$ of a second (an oscillation frequency of 32 kilohertz, or kHz), or when the GPS time is computed from range measurements relative to a specific clock epoch. GPS time can have accuracy on the order of a few tens of nanoseconds. GPS time is fundamental to the GPS system.

During the initial determination of position of the GPS receiver unit, a "cold start" process is initiated. For a cold start, the GPS receiver begins the acquisition process without knowledge of GPS time, GPS position or ephemeris data for the GPS satellite orbits. Therefore, the GPS receiver unit searches for all satellites over a wide range of possible frequencies. In some situations, almanac data is also unknown for the GPS satellites. Eventually, after many seconds, at least four satellite signals are acquired. The satellites' PN encoded signals identify each of the satellites and each satellite transmits ephemeris data. Ephemeris data includes precise orbital information, for example orbital location as a function of GPS time, for that satellite.

If some information is known prior to acquisition, the time to acquire sufficient information from the GPS satellites for navigation can typically be reduced. For example, a "warn start" process may be used if almanac data, approximate GPS time and approximate receiver position allow approximate satellite locations and Doppler shifts to be calculated. A "hot start" process may be used if the ephemeris, approximate GPS time and approximate receiver position are known so that approximate satellite locations and Doppler shifts can be calculated and the time to collect ephemeris data can be avoided. However, a complete six-second sub-frame of data from at least one satellite is required in order to establish time with sufficient accuracy to compute a navigation solution.

The GPS receiver unit determines its distance from each satellite by determining the code phase of the transmission from each satellite. The code phase (CP) is the delay, in terms of chips or fractions of chips, that a satellite transmission experiences as it travels the approximately 11,000-mile distance from the satellite to the receiver. At each satellite, the time of transmission of each PN chip is controlled down to a few nanoseconds. Consequently, knowledge of precise GPS time allows the GPS receiver unit to know exactly what chip of a satellite's waveform is being transmitted at any given time. If the arrival of a given chip at a receiver is measured relative to a local timing epoch, such as the T20 epoch, then the propagation time of that chip from the satellite to the GPS receiver unit can be measured as accurately as GPS time at that T20 epoch is known. If the propagation times from each of four satellites are measured relative to the same T20 epoch, then the GPS receiver unit can solve for the location of the receiver in three-dimensional space, along with the error in the value of GPS time at the reference T20 epoch.

The GPS receiver unit precisely determines the distance to the satellite by multiplying the time delay by the velocity of the transmission from the satellite. The GPS receiver unit also knows the precise orbits of each of the satellites. Updates of the locations of the satellites are transmitted to the receiver by each of the satellites. This is accomplished by modulating a low frequency (50 Hz) data signal onto the PN code transmission from the satellite. The data signal encodes the time-dependent positional information for the satellite and the time errors in its on-board clock in the ephemeris data subframes. Precise time of each satellite's transmission is given in each six-second data sub-frame relative to a reference chip at the start of the next sub-frame.

Conceptually, the receiver uses the estimated range from a satellite to define a sphere around the satellite upon which the receiver must be located. The radius of the sphere is equal to the range to the satellite the receiver has determined from the code phase. The receiver performs this process for at least three satellites. The receiver derives its precise location from the points of intersection between the at least three spheres it has defined. Measurements from three satellites are sufficient if the receiver knows the altitude at its location. When the altitude is unknown, measurements from four satellites are required so that altitude can also be solved for, along with latitude, longitude and the error in the local clock measurement epoch (e.g., GPS time at the T20 epoch).

The detection of the signals from each satellite can be accomplished in accordance with a GPS signal detector that is disclosed in, for example, but not limited to, U.S. patent application Ser. No. 09/281,566, entitled "Signal Detector Employing Coherent Integration", filed on Mar. 30, 1999, which is incorporated herein by reference. A signal detector as disclosed therein may use a correlation mechanism, for example a matched filter, and a coherent integration scheme to detect the appropriate satellite signals.

Once the satellite signals are detected, the low frequency 50 Hz data that is modulated onto the PN code signal received from the satellite is decoded to determine the precise location of the GPS receiver unit. Conventional location determination processes require several seconds to complete. These conventional schemes typically run continually, thus consuming valuable processor resources. This is especially disadvantageous in the case of GPS receiver unit with very limited power resources, such as a portable GPS receiver unit. Portable GPS receiver units may be designed such that selected components may be shut off, or powered down, during periods when the user is not querying the GPS receiver unit for location information. When the user (or an automated process) queries the GPS receiver unit, the GPS receiver unit reactivates the powered down components and reacquires satellite data to determine the current location. If the user's location has not changed significantly, and/or if the shut down period has been sufficiently short, it may be possible to reacquire the previous satellite signals and achieve nearly immediate correlation of the code phase data (rather than the several seconds to minutes associated with the hot, warm or cold start procedures). Nearly immediate correlation of the code phase data saves several seconds, thereby saving a substantial amount of the limited power available in a portable GPS receiver unit.

However, reacquisition of the satellite signals with nearly immediate correlation of the code phase data requires precise time keeping during the period the receiver is off. More particularly, the GPS oscillator and timing system must maintain accuracy of the various clocking signals in the GPS receiver unit to within ±0.5 ms to avoid losing track of which PN code period within the overall GPS signal structure the receiver expects to receive at reacquisition. This 0.5 ms criterion corresponds to one half of a 1 ms code period. In addition, movement of the GPS receiver unit introduces error that may be associated with timing of the PN code signals. If the accuracy of the clocking signals plus the error introduced by movement of the GPS receiver unit can be maintained to within ±0.5 ms of the incoming PN code signals, the time consuming and power consuming process of determining location using the hot, warm or cold start procedures may be avoided because the GPS receiver unit matching filters can immediately lock onto the four previously acquired satellite PN code signals and know which PN code period of the signal structure has been acquired. Otherwise, the hot, warm or cold start procedures must be used, depending on the prior information (e.g., almanac, ephemeris, GPS time, and receiver position) that was preserved while selected receiver components, or the entire receiver, were powered down.

Typically, a conventional real time clock (RTC) circuit may be used to maintain rough GPS time while the rest of the GPS circuitry is off. Typical RTC circuits may maintain accuracy of a few seconds over extended periods. Such accuracy is adequate for hot and warm starts. However, the accuracy of a conventional real time clock degrades rapidly below the +/−0.5 ms level due to poor stability and temperature characteristics of typical low cost, low power RTC circuits. Therefore, even after a very brief time, a hot start is required.

Maintaining accuracy of the various clocking signals in the GPS receiver unit to within ±0.5 ms (one half of a 1 ms code period) is not possible with a conventional GPS oscillator and timing system if the oscillator is powered down between navigation updates. However, since the GPS oscillator and the associated timing system consume significant power, powering down these components is very desirable in a portable GPS receiver unit to conserve power resources.

Under some circumstances, the real time clock may stop altogether due to partial or total loss of the local power source. If the RTC is not operating at all, it is evident on start-up that a cold start procedure should be used to acquire satellites. Under other circumstances, the RTC may seem normally operational on start-up, but may be inaccurate because it has experienced partial power loss, or a brownout condition that caused the RTC to miss cycles. For example, a battery used to power the RTC may provide inadequate power levels because it is near the end of its life or because it is subjected to temperatures beyond its operating range. This is especially problematic when the time from the RTC is transferred to the GPS clocking scheme to support rapid acquisition. If incorrect RTC time is relied on, incorrect range measurements result. Using incorrect range measurements in a navigation solution results in an incorrect position calculation.

One prior RTC failure detector includes a circuit correctly sets a status flip-flop when the RTC backup power is applied. Usually, this backup power is a small battery. Hence, the circuit can accurately detect when the backup battery is replaced. This is a relatively useless feature. The user knows the battery is being replaced. A set up routine may be invoked after battery replacement to set the time.

Prior art methods of RTC failure detection that essentially monitor voltage levels are particularly inadequate when the battery is near its end of life or when the battery is subjected to wide variations in temperature. For example, the GPS receiver may be placed in a car in a cold environment. The battery voltage and current capability may decline in this condition so that the RTC oscillator stops. The user may then take the receiver, place it in an inside jacket pocket and take a hike. The receiver warms up enough that the battery recovers its capacity and the oscillator restarts. When the user attempts to use the receiver, the receiver makes the usual checks. The RTC appears to be running, because time is incrementing. The battery backed RAM (usually on the same battery as the RTC) has good checksums because the RAM retains its contents to much lower voltages than the RTC oscillator needs for operation. The RTC oscillator failure FF indicates good status, because the voltage did not fall below the reset threshold and because the logic may retain its valid state at lower voltages than the oscillator requires for operation. Hence, the receiver tries to use the RTC value, assuming it is good, and produces an incorrect solution because the time was in fact in error. The receiver takes longer to produce a solution, or worse yet, continues to produce bad solutions.

In theory, if the status flip-flop failure detection voltage threshold could be set accurately, the failure would be detected. This is difficult for a number of reasons. One wants to set the threshold as low as possible so that the battery life is maximized. This means the threshold must be precise and that it must respond to different oscillator requirements for oscillation. These different conditions can be a function of the particular crystal, the temperature and circuit parameter variations over manufacturing process variations and so on. Hence, some margin in the threshold has to be provided, shortening the useful battery life. Even with a margin, some failure events may occur on a statistical basis.

It is desirable to have a method and apparatus for GPS navigation can be operated to conserve power resources by powering down selected components when they are not in use, yet can quickly acquire satellites on start-up using a real time clock th at operates continuously. It is further desirable to have an RTC clock failure detection circuit that reliably detects oscillator failure without compromising battery life.

SUMMARY OF THE DISCLOSURE

A low power real time clock (RTC) is operated continuously in a Glob al Positioning System (GPS) receiver unit. Power is conserved in the. GPS receiver unit by shutting down selected components during periods when the GPS receiver unit is not actively acquiring satellite information used to calculate the location of the GPS receiver unit. A K32 (typically a nominal 32,768 Hz) oscillator residing in a low power time keeping circuit accurately preserves GPS time when the selected components are shut off. The K32 oscillator generates the RTC or low power clock. The terms low power clock and RTC are used interchangeably herein.

A method and apparatus for determining whether the RTC is accurate enough to be used on start-up is disclosed. In one embodiment, actual loss of RTC clock cycles, such as during a brownout episode, is detected. In one embodiment, an output of an RTC clock oscillator is half-wave rectified and placed on the input to a resistor-capacitor (RC) circuit with a calculated RC time constant. The output of the RC circuit is placed on one input of a voltage comparator. A reference voltage is placed on the other input of the voltage comparator. If the RTC oscillator misses a predetermined number of cycles, the output voltage of the RC circuit on the voltage comparator decays and the comparator detects the loss of clock cycles, which is reflected on the voltage comparator output.

BRIEF DESCRIPTION OF THE DRAWINGS

The components in the figures are not necessarily to scale, emphasis instead being placed upon illustrating the principles of the invention.

FIGS. 7A, 7B, and 7C are a flow chart illustrating one embodiment of a process that includes using an RTC clock signal to update a GPS clock signal, and determining whether or not an estimated GPS time is sufficiently accurate to acquire position of a GPS receiver.

DETAILED DESCRIPTION

Figure 1:
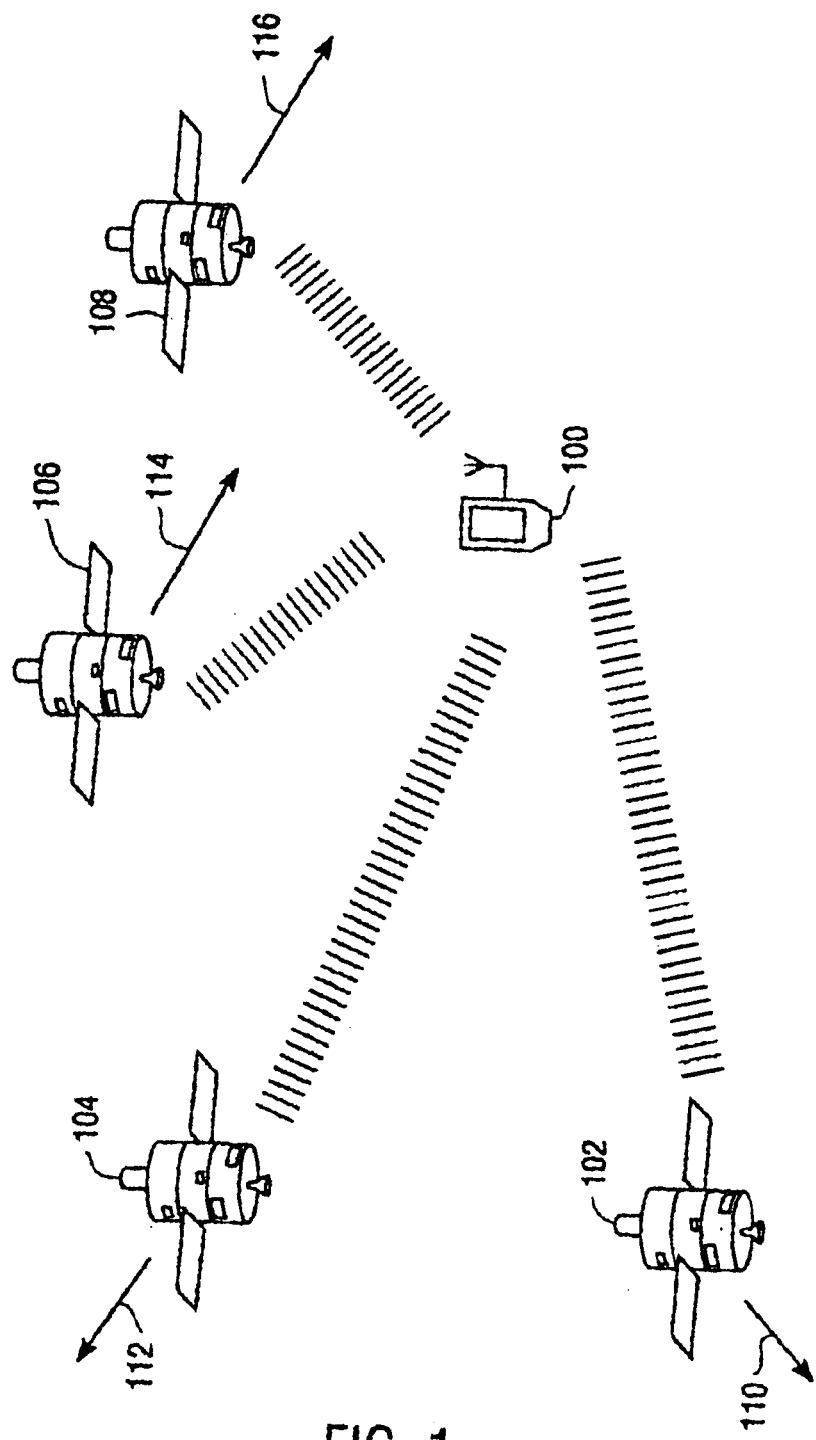
FIG. 1 is a block diagram of an exemplary environment for operation of a global positioning system (GPS) receiver.

FIG. 1 illustrates an example environment for operation of a global positioning system (GPS) receiver. FIG. 1 shows a GPS receiver unit 100 and four GPS satellites 102, 104, 106 and 108. Each satellite 102, 104, 106 and 108 is transmitting to the GPS receiver unit 100. Satellite 102 is moving towards the GPS receiver unit 100 along the line of sight (LOS) 110 at a velocity $v_a^+$; satellite 104 is moving away from the GPS receiver unit 100 along the LOS 112 at a velocity $v_b^-$ and satellite 106 is moving away from the GPS receiver 100 along the LOS 106 at a velocity $v_c^-$. Consequently, assuming a carrier wavelength of $\lambda$, the transmission from satellite 102 experiences a positive Doppler shift of $v_a^+/\lambda$; the transmission from satellite 104 experiences a negative Doppler shift of $v_b^-/\lambda$; and the transmission from satellite 106 experiences a negative Doppler shift of $v_c^-/\lambda$.

Satellite 108 is similarly moving away from the GPS receiver unit 100 along the LOS 116 at a velocity $v_d^-$. Information provided by the fourth satellite 116 may be used in some applications to determine the error in the altitude value of the receiver if it is not known beforehand. The four satellites must have adequate geometry in order to provide measurements capable of solving for latitude, longitude, altitude and time error. Range measurements from more than the minimum quantity of four visible satellites may be required to solve for the four unknown quantities when satellite geometry is poor.

Figure 2:
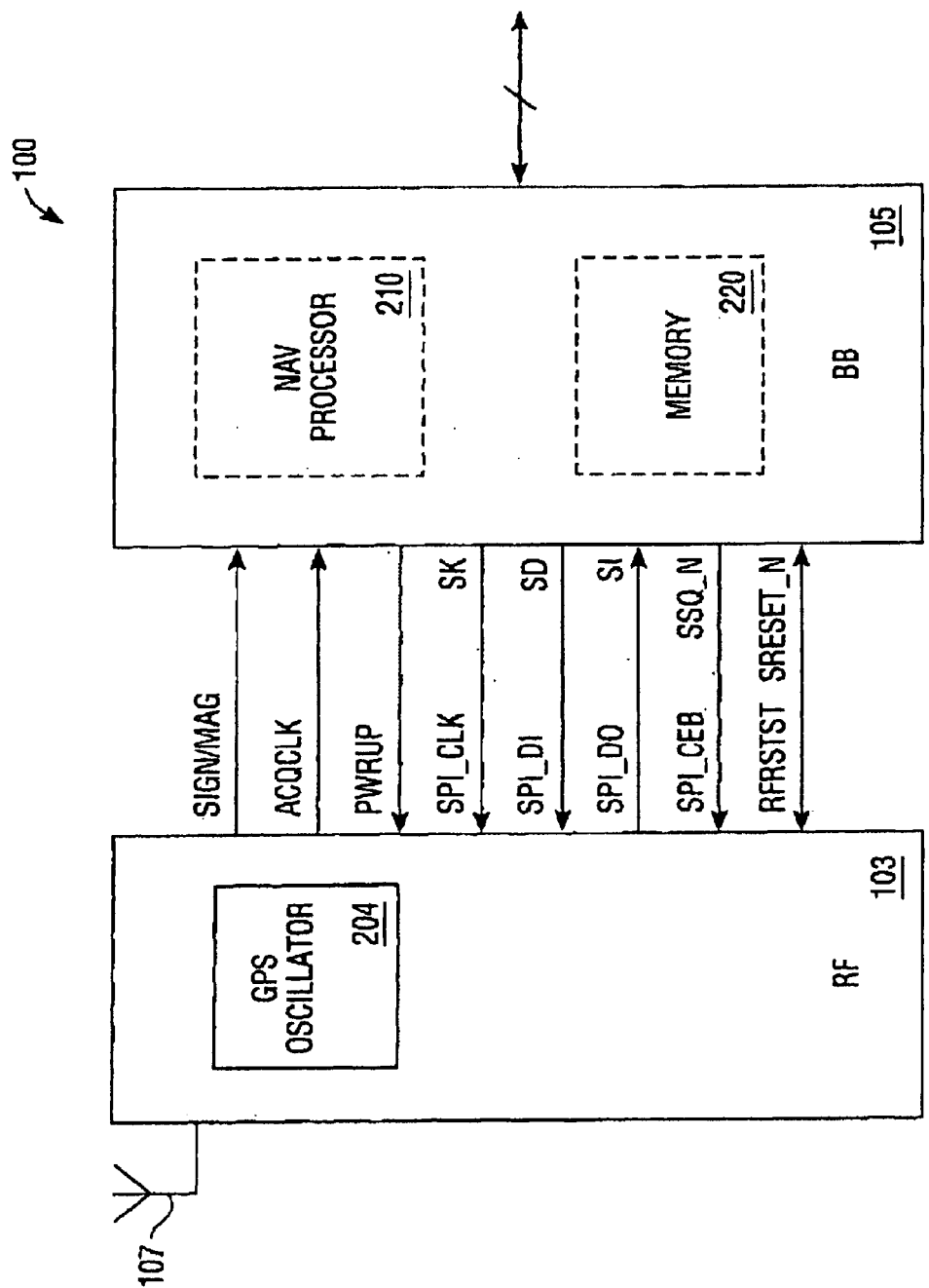
FIG. 2 is a block diagram of an embodiment of a GPS receiver.

FIG. 2 is a block diagram of a GPS receiver unit 100 according to one embodiment. The GPS receiver 100 includes radio frequency (RF) functionality shown here residing on an RF chip 103. The GPS receiver unit 100 further includes baseband functionality shown here residing on baseband chip 105. Various components that perform various functions will be described in certain arrangements herein, but the invention as disclosed contemplates alternative arrangements. For example, the baseband chip 105 may include a navigation processor 210 and a memory device 220, as shown. In other embodiments, the navigation processor and the memory device may not reside on the baseband chip 220, but may communicate with the baseband chip 220 through, for example, a peripheral interface. In yet other embodiments, all of the components shown and functionalities described reside on one chip.

The RF chip 103 includes a GPS oscillator 204, which is a high accuracy oscillator used to keep GPS time. The following is an overview of general operation of the GPS receiver unit 100 according to one embodiment. Components named in the following overview will be shown and described below. Power is conserved in GPS receiver unit 100 by shutting down selected components, including the GPS oscillator 204, during periods when the GPS receiver unit is not actively acquiring satellite information used to calculate the location of the GPS receiver unit. A K32 (typically a nominal 32,768 Hz) oscillator residing in a low power time keeping circuit accurately preserves GPS time when the selected components are shut off.

The GPS oscillator 204 generates a clock signal, referred to as the M11 clock signal, that is used to accurately determine GPS time based upon signals detected from the plurality of satellites. An edge aligned ratio counter continuously monitors the K32 and M11 clock signals with free running counters, and when an edge of the K32 clock signal aligns with an edge of the M11 clock signal within a predetermined small tolerance, the K32 and M11 counter values are latched. Since the GPS timing generator that produces the T20 epochs is driven by the M11 clock, the free running M11 counter can also be latched at a T20 epoch to establish a relationship between that counter and the T20 epoch. Thus, the GPS receiver unit 100 is able to correlate the timing and the rates of the K32 clock signal and the GPS M11 clock signal with the T20 timing epoch. The correlated timing and rates of the K32 clock signal, the GPS M11 clock signal and the T20 epoch are provided to the navigation processor 210 so that a sufficiently accurate estimate of GPS time at a T20 epoch is calculated to allow determination of the PN code periods in the signal structures of acquired satellite PN code signals.

During operation of the GPS receiver unit, frequencies of the local GPS oscillator and the K32 oscillator are detected at various operating temperatures such that a temperature/frequency is defined for both oscillators. The data for both temperature/frequency tables are stored in a memory.

Selected components residing on the GPS receiver unit, including the GPS oscillator, are then shut down (deactivated) to conserve power. The low power time keeping circuit remains on. Periodically, after a predetermined period of time, the system is powered up in response to a wake-up command generated by an alarm unit. The K32 clock signal from the low power time keeping circuit is recalibrated based upon the actual operating temperature of the K32 oscillator and data from the K32 clock temperature/frequency table. Thus, the K32 clock rate is periodically updated to more accurately track GPS time.

At a particular point in time, a navigation update is performed in accordance with the requirements of the particular system application. The periodically recalibrated K32 clock signal and data from the GPS clock temperature/frequency table are used to set the M11 clock signal rate and GPS time. Positions of the GPS satellites are then estimated such that the real GPS time can be quickly determined from the received satellite signals. Once the precise GPS time is determined from the detected satellite signals, the M11 and K32 signals are latched together and correlated with the real GPS time at a T120 epoch, as described above, to further improve and update their temperature calibration tables. The selected components are then shut off once again to conserve power.

The process described above is repeated as necessary so that accurate GPS time is maintained by the low power time keeping circuit. When a user of the GPS receiver unit requests position information, the GPS receiver unit determines position from the GPS satellites more quickly, because the GPS satellite positions and ranges are estimated with a high degree of precision based on more accurate time keeping. That is, the power consuming and time consuming process of detecting sub-frame data and determining sub-frame timing to set the GPS time accurately enough to estimate the ranges to the GPS satellites using conventional processes is avoided.

Referring again to FIG. 2, the RF chip 103 and the baseband chip 105 communicate through a system interface 109. In one embodiment, the system interface 109 is a serial peripheral (SPI) interface, but in other embodiments, the system interface could be any adequate messaging scheme. The RF chip 103 receives signals from satellites in view via an antenna 107. The satellite signals are sampled and sent to the navigation processor as a serial stream on the SIGN/MAG line. The baseband chip 105 and its components operate with an ACQCLK signal that is generated from a GPS oscillator crystal, and typically has a frequency that is a multiple of $F_0$. Various other signals are exchanged via the system interface as show. A power up (PWRUP) signal is sent to the RF chip 103 to power up the powered down components of the RF chip 103 prior to acquisition and navigation. An SPI_CLK signal is sent to the RF chip 103 from the baseband chip 105 for synchronization. Data lines SPI_DI and SPI_DO carry data back and forth. A chip enable signal (RFRST) is sent to the RF chip 103 on the RFRST line and a reset signal (SRESET_N) is sent to the baseband chip 105 on the RFRST line. In other embodiments, various different protocols are used to exchange information between the RF chip 103 and the baseband chip 105.

Figure 3:
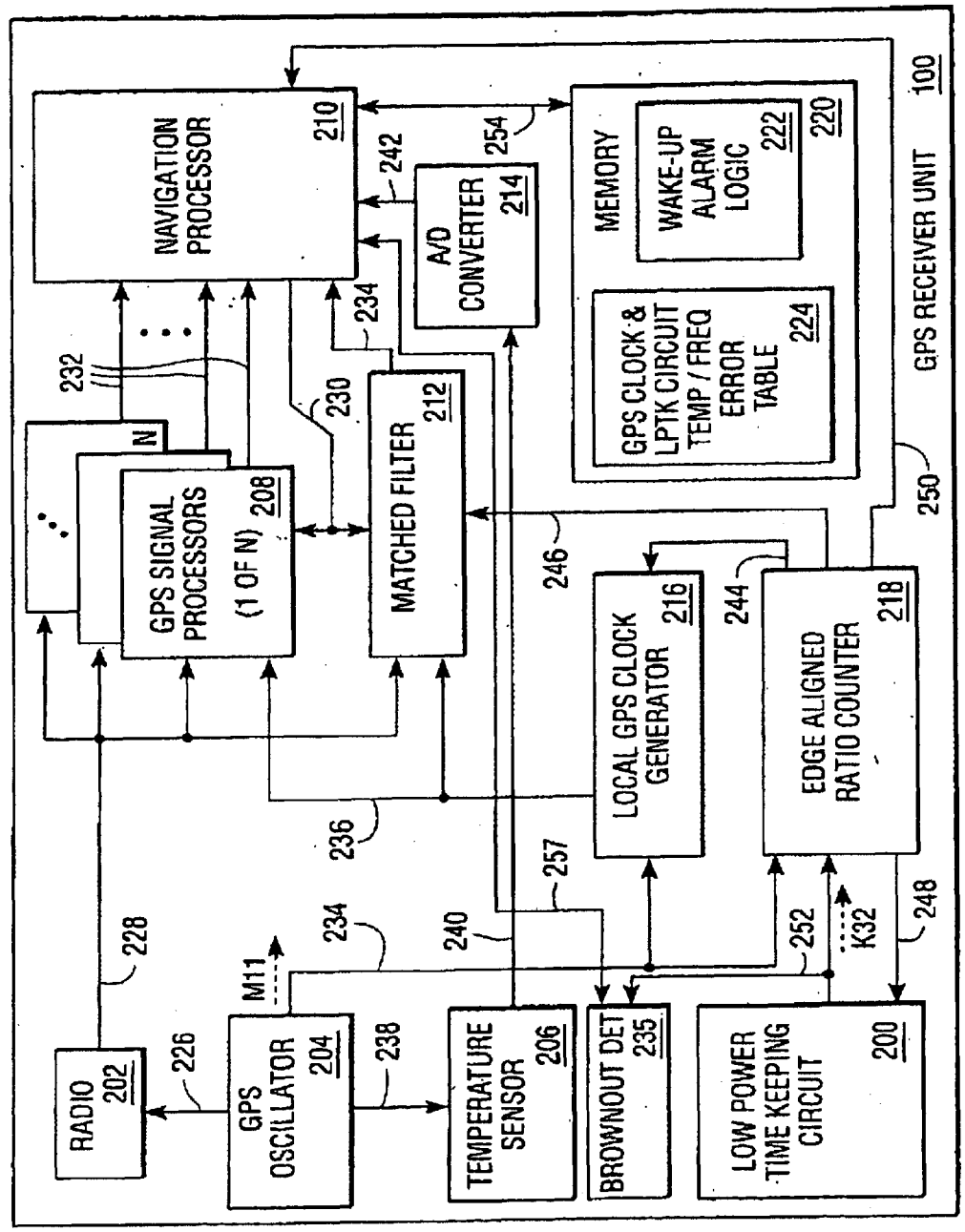
FIG. 3 is another block diagram of the embodiment of the GPS receiver.

FIG. 3 is a block diagram illustrating selected components of the GPS receiver unit 100, including a low power time keeping circuit 200. GPS receiver unit 100 includes at least a radio 202, the local GPS oscillator 204, temperature sensor 206, a plurality of GPS signal processor channels 208 (1 through N), the navigation processor 210, matched filter 212, A/D converter 214, local GPS clocks generator 216, edge aligned ratio counter 218, memory 220 and low power time keeping circuit 200. Memory 220 further includes the wake-up alarm logic 222 and an allocated portion for the GPS clock Low Power Time Keeping (LPTK) Circuit error temperature/frequency error table 224. FIG. 3 is generally limited to illustrating those components relevant to the operation and functioning of the invention. Other components, not shown, are included in the GPS receiver unit 100. These components are omitted because a discussion of the operation and functionality is not necessary for the disclosure.

Radio 202 detects a plurality of GPS signals from a plurality of satellites, such as, but not limited to, satellites 102, 104, 106 and 108 of FIG. 1. In one embodiment the radio 202 selects the GPS L1 band (1575.42 MHz). However other embodiments may select other suitable signals. Radio 202 also receives a timing signal from local GPS oscillator 204, via connection 226. The timing signal, in one embodiment, is generated by a crystal (not shown) residing in the local GPS oscillator 204 that oscillates at substantially 10.949 mega-hertz (MHz), and is referred to as the M11 clock signal. Other embodiments may employ a local GPS oscillator operating at a different frequency clock signal without departing substantially from the operation and functionality of the invention. The received GPS signals and the M11 timing signal are provided to the plurality of GPS signal processors 208 and matched filter 212. Each one of the plurality of GPS signal processors 208 corresponds to a particular signal channel. FIG. 3 indicates that there are N GPS signal processors. For instance, an exemplary embodiment of the GPS receiver unit 100 may employ twelve GPS signal processors (N=12) that are configured to process in parallel twelve signal channels.

The signal processors 208 and matching filter 212 receive a sequence of prepositioning commands from the navigation processor 210, via connection 230, that indicate specific GPS PN codes that each signal processor is to search for. Information provided by navigation processor 210 may also include Doppler correction values, GPS oscillator error correction values, PN code phase information and/or other relevant information regarding the incoming satellite signals.

In one embodiment, the matched filter 212 determines the current PN code phase of a detected signal and provides the information to the signal processors 208 to allow the signal processor channel to more rapidly acquire that signal. When one of the signal processors 208 detects a signal on a channel such that the PN code, code phase and frequency correction matches that of one of the incoming GPS signals, the GPS signal processor synchronizes to and tracks the incoming satellite signal. Another embodiment employs only the matched filter 212 to determine position (although with a lesser degree of accuracy since the matched filter 212 determines the current code phase of a signal at a point in time and does not continually track it). Current embodiments of the matched filter also permit fast multiplexing of the matched filter that does allow continuous, accurate tracking of all acquired satellite signals.

The matched filter 212 and/or the GPS signal processors 208 provide code phase information regarding the acquired signals to the navigation processor 210, via connections 234 and/or 232, respectively. Navigation processor 210 then calculates the position of the GPS receiver unit 100 after sufficient information from at least four GPS satellite signals has been provided by the matched filter 212 and/or the GPS signal processors 208. The location information is then output to an interface system (not shown) so that a user may learn of the position of the GPS receiver unit 100.

The local GPS oscillator 204 provides a signal having a predefined oscillation frequency. For example, but not limited to, the oscillation frequency of a crystal (not shown) residing in one embodiment of the local GPS oscillator 204 is configured to equal 10.949296.875 megahertz (MHz). Here, the precise nominal value of the oscillation frequency equals $137 F_0/128$. $F_0$ is a fundamental parameter of the GPS system equal to 10.23 MHz. The GPS L1 frequency of the received GPS signals is $154 F_0$. The chip rate of the Clear/Acquisition GPS PN codes used in commercial systems is $F_0/10$. One embodiment of the GPS oscillator 204 is referred to as outputting an M11 clocking signal, where the term "M11" corresponds to the $137 F_0/128$ frequency of 10.949296.875 MHz. Other signals of the GPS system, including frequencies and codes used by military receivers, are also related to $F_0$.

The local GPS oscillator 204 provides the M11 clocking signal, via connection 234, to the local GPS clocks generator 216. Local GPS clocks generator 216 derives a plurality of clock signals from the M11 clocking signal. These clocks correspond to the local GPS timebase. Of particular interest, one of the plurality of clocks is known as the local timing epoch, the T20 clock. The T20 clock derives its name from the fact that it is 20 ms between clock ticks. Many of the code phases measured in the GPS signal processors 208 and the matched filter 212 are referenced to a common T20 epoch. Selected clocking signals generated by the local GPS clocks generator 216 arc provided to the GPS signal processors 208 and the matched filter 212 over connection 236.

The low power time keeping circuit 200, described in detail below, provides a clocking signal to the edge aligned ratio counter 218, via connection 252. The clocking signal rate, in one embodiment, is provided by a crystal oscillating at substantially 32.768 kilohertz (kHz), and is referred to as the K32 clock signal. Also, the low power time keeping circuit 200 provides information to the navigation processor 210 (connections not shown). Typically, the information provided to the navigation processor 210 by the low power time keeping circuit 200 is an estimate of the GPS time at a T20 epoch. Other embodiments may employ a different frequency clock signal without departing substantially from the operation and functionality of the invention.

A brownout detection circuit 235, shown and described in more detail below with reference to FIGS. 5 and 6, detects loss of RTC clock cycles. The brownout detection circuit 235 detects a situation in which loss of RTC clock cycles have made the RTC too inaccurate to use on start-up and notifies the navigation processor accordingly, as described in more detail below.

The edge aligned ratio counter 218 provides input to the local GPS clocks generator 216 (via connection 244), to the matched filter 212 (via connection 246), and to the low power time keeping circuit 200 (via connection 248). For convenience of illustration, connections 244, 246 and 248 are illustrated as separate connections. However, one or more of these connections could be implemented as a single connection. The edge aligned ratio counter 218 also provides information to the navigation processor 210 via connection 250. The edge aligned ratio counter 218 continuously counts and monitors the K32 and M11 clock signals, and when an edge of the K32 clock signal aligns with an edge of the M11 signal, within a predetermined small tolerance, the K32 and M11 counter values are latched. At the time of latching, the edge aligned ratio counter 218 provides a signal to the local GPS clocks generator 216 so that the current T20 clocking count is latched to relate the K32 and M11 counts to the T20 epoch. In the same manner, the edge aligned ratio counter 218 provides a signal to the low power timekeeping circuit 200, via connection 248, that causes the current low power timekeeping circuit 200 estimate of GPS time to be latched. Thus, the GPS receiver unit 100 is able to correlate the timing and the rates of the K32 clock signal and the GPS M11 clock signal with the T20 epoch and the current low power timekeeping circuit 200 GPS time. When the correlated timing and rates of the K32 clock signal, the GPS M11 clock signal, the low power time keeping 200 GPS time and the T20 epoch count are provided to the Navigation processor 210, the low power time keeping circuit 200 estimate of GPS time at a T20 epoch can be calculated and the relative rates of these two clocks can be estimated from counter ratios of the two clocks in the edge aligned ratio counter 218. In order to estimate the relative clock frequency, two sets of counter values from successive edge alignment events are differenced and the ratios of the differences taken.

Note that the rate and timing phase of all clocks can be accurately related. The EARC free running M11 counter and T20 epoch generator are both driven by the M11 clock. Hence, latching the M11 counter at a T20 epoch relates the counter values and T20 epoch times. The RTC time and the EARC free running K32 counter are both driven by the K32 clock. Hence, latching the K32 counter at a RTC alarm event relates the counter values and the RTC times. The RTC has an alarm circuit that produces a pulse, useful as a latching signal, at a desired RTC time. Using the EARC to latch the free running K32 and M11 counters at an edge alignment event relates the K32 and M11 counter values. Differencing the respective K32 and M11 counter values from two alignment events allows the ratio of the K32 and M11 clock rates to be related. Finally, when GPS signals are being tracked, calculation of the GPS solution provides the precise GPS time at a T20 epoch and the rate of the T20 epochs relative to GPS time. Hence, the K32 and M11 clock rates can be related to GPS clock rate and the RTC and T20 epoch times can be related to GPS time.

One skilled in the art will appreciate that the above described operation of the GPS receiver unit 100 is intended as a general description of one system used by an embodiment of a GPS receiver unit. Not all GPS receiver unit components are described or illustrated, as such components may not necessarily relate to the invention. Thus, the description of the above-described components residing in the GPS receiver unit 100 is generally limited to describing the operation and functionality of those components to the extent necessary for the understanding of the invention. Furthermore, a GPS receiver unit or other processor systems employing the invention may have the components shown in FIG. 3 connected in a different order and manner than shown in FIG. 3, or may not include all of the component shown in FIG. 3, or may include additional components connected in some manner with the components shown in FIG. 3. Any such variations in GPS receiver unit or a processor system that utilizes the invention are intended to be within the scope of this disclosure and be protected by the accompanying claims.

Temperature sensor 206 detects the operating temperature of the local GPS oscillator 204, via connection 238. The sensed temperature information is then provided to the A/D converter 214 over connection 240. A/D converter 214 converts the sensed operating temperature information into a suitable format and provides the information to the navigation processor 210, via connection 242. Temperature sensor 206 and A/D converter 214 may be implemented using well-known components and techniques employed in the art of detecting temperatures. The temperature sensing functions performed by temperature sensor 206 and/or AID converter 214 may be implemented with any type of electronic, solid state and/or firmware type temperature sensors or means commonly employed in the art of sensing temperatures. Such a temperature sensor employed in the invention is implemented by a combination of software and firmware using components and techniques commonly employed in the art of sensing temperatures. Detailed operation of temperature sensor 206 and AID 214, including their individual components, are not described in detail other than to the extent necessary to understand the operation and functioning of invention. One skilled in the art will realize that the temperature sensor 206 and the A/D converter 214 may be implemented using a variety of well known devices without departing substantially from the functionality and operation of the invention.

Navigation processor 210 processes the received temperature information such that a frequency error in the GPS oscillator signal due to the operating temperature of the local GPS oscillator 204 is determined. An exemplary process for determining this frequency error employs a table having temperature and frequency error information for a range of operating temperatures. In one embodiment, the GPS clock temperature/frequency error table 224 resides in a non-volatile memory 220. Initially, a frequency/temperature error algorithm, such as a polynomial representation of the frequency error as a function of temperature of a typical oscillator crystal, is employed to approximate the temperature related frequency error. As the GPS receiver unit 100 is operated over time, the portion of the temperature/frequency error table 224 for the GPS clock data is filled with more accurate information of the frequency error at particular operating temperatures for the local GPS oscillator 204 based upon measurements of frequency error based on GPS satellite range and range rate measurements at various operating temperatures. Solution of the GPS navigation equations allows a determination of receiver spatial velocity and local oscillator frequency error (rate of change of GPS time error), as well as spatial position and GPS time error. The oscillator frequency error so determined is paired with the current oscillator temperature as a new update point in the temperature/frequency error table 224.

Prior to entering the navigation mode, the receiver uses the temperature/frequency error table 224 to aid in the satellite acquisition process. Upon receiving the current operating temperature, the navigation processor 210 looks up the table information for the GPS clock residing in the temperature/frequency error table 224. The actual operating temperature of the local GPS oscillator 204 is correlated with the data in the temperature/frequency error table 224 to estimate the frequency error in the signal generated by the local GPS oscillator 204. This GPS clock frequency error information is provided to the GPS signal processors 208 and the matched filter 212, via connection 230. Alternatively, when the temperature/frequency error table 224 is only partially filled out and does not contain sufficient data for the exact current operating temperature, a frequency/temperature error extrapolation or interpolation algorithm may be used to estimate the error in the GPS oscillator signal due to the operating temperature of the local GPS oscillator 204. This algorithm makes use of the points in the table at the nearest temperatures to the current operating temperature along with the shape of the nominal temperature vs. frequency curve of the type of GPS clock oscillator crystal in use.

Figure 4:
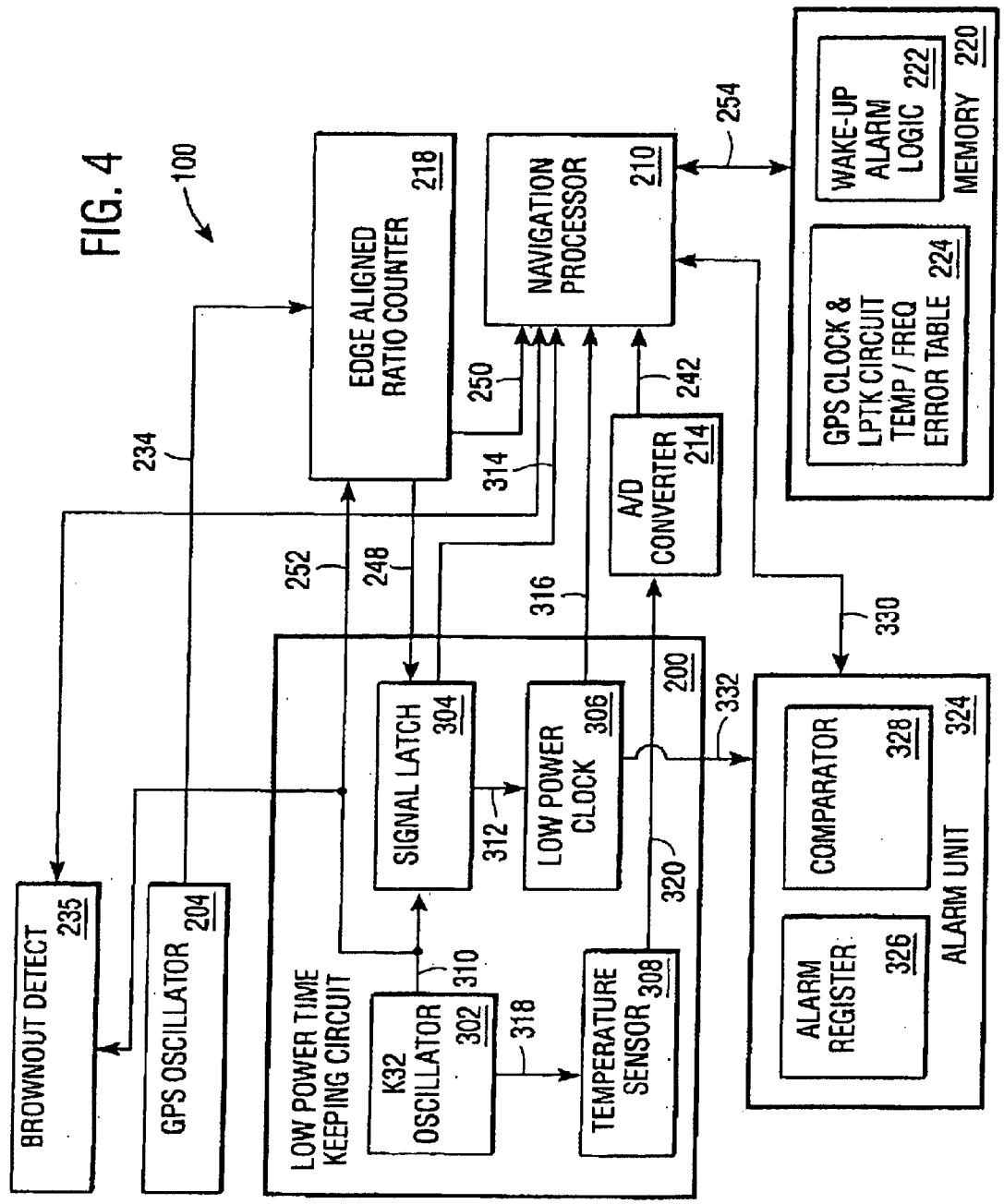
FIG. 4 is another block diagram of the embodiment of the GPS receiver.

FIG. 4 is a block diagram illustrating additional detail of the GPS receiver unit 100. Low power time keeping circuit 200 further includes at least a K32 oscillator 302, a signal latch 304, a temperature sensor 308 and a low power clock, or real time clock (RTC) 306.

K32 oscillator 302 outputs the RTC clock signal, also referred to as the K32 clock signal, having a frequency substantially equal to 32.768 kHz, via connection 310. Since the K32 oscillator 302 provides a K32 clock signal having a time resolution of 32768 Hz, which equals approximately 30 microseconds, the K32 oscillator 302 provides a clocking signal having a frequency well within the ±0.5 ms resolution of a single PN code period.

The RTC clock signal is sent to the brownout detection circuit 235 on connection 310. The brownout detection circuit 235 is explained in more detail below.

K32 oscillator 302 provides its output K32 clock signal to the counter in the low power clock 306 and to the edge aligned ratio counter 216. When the edge aligned ratio counter 216 determines that an edge of the K32 clock signal aligns with an edge of the M11 signal, within a predetermined small tolerance, a latch signal is provided to the signal latch 304, via connection 248. The current value of the low power clock counter 306 is latched in signal latch 304 when the edge alignment signal is received, via connection 248. The latched value in signal latch 304 is provided to the navigation processor 254, via connection 316. The signal on connection 316 is thus the low power clock signal, or RTC clock signal. The edge aligned ratio counter 216 provides the latched values of the M11 and K32 counters in the edge aligned ratio counter at the alignment event epoch to the navigation processor 210. Because the T20 epochs can be directly related to the GPS oscillator M11 clock (not shown), the M11 counter value in the edge aligned ratio counter 216 can be related to the K32 counter value in the low power clock 306 as an offset of a specific number of integral M11 clock ticks. The number of clock ticks is integral (has no fractional clock tick component) because the counter values were all acquired when the K32 and M11 clock edges were aligned within a small (negligible) window of error. Because the low power clock 306 has been closely calibrated to the time and rate of the GPS system time, knowing the value of the low power clock 306 and an offset to a specific T20 epoch in the local GPS time line allows the GPS time of the low power time keeping circuit 200 to be transferred accurately to the T20 epoch. Since all GPS measurement signal processing is related to T20 epochs, the measurements can now be made relative to an accurate local GPS time estimate.

The K32 oscillator 302 and the low power clock 306 are, relatively, very low-power consuming devices, particularly when compared to the selected components residing in the GPS receiver unit 100 that are powered down in a manner described below. Furthermore, the K32 oscillator 302 and the low power clock 306 are commercially available and relatively inexpensive. Alternatively, and preferably, the K32 oscillator 302 and low power clock 306 can be integrated into the GPS device 100 to provide even lower cost, smaller size and more accurate time-transfer performance.

As illustrated in FIG. 4, a temperature sensor 308 detects the operating temperature of the K32 oscillator 302, via connection 318. The sensed temperature information is then provided to the A/D converter 214, via connection 320. A/D converter 214 converts the sensed temperature information into a suitable format and provides the K32 operating temperature information to the navigation processor 210, via connection 242. Temperature sensor 308 may be implemented using well-known components and techniques employed in the art of detecting temperatures. The temperature sensing functions performed by temperature sensor 308 may be implemented with any type of electronic, solid state or firmware type temperature sensor or means commonly employed in the art of sensing temperatures. Such a temperature sensor 308 employed in the invention is implemented by a combination of software and firmware using components and techniques commonly employed in the art of sensing temperatures. Detailed operation of temperature sensor 308 is not described in detail other than to the extent necessary to understand the operation and functioning of the invention. One skilled in the art will realize that the temperature sensor 308 may be implemented using a variety of well known devices without departing substantially from the functionality and operation of the invention. Any such embodiments of temperature sensor 308 that are employed as a part of the invention are intended to be within the scope of this disclosure and to be protected by the accompanying claim.

A portion of the temperature/frequency error table 224, included in memory 220, is used to store temperature/frequency data for the K32 oscillator 302. Navigation processor 210 calculates a frequency error associated with the signal from the K32 oscillator 302 based upon the current operating temperature of the K32 oscillator 302, much like the local GPS oscillator 204 frequency error described above. As the GPS receiver unit 100 is operated over time, the temperature/frequency error table 224 is filled with more accurate information of the frequency error at particular operating temperatures for the K32 oscillator 302 based upon measurements of frequency error at various operating temperatures. Unlike the case of the M11 GPS oscillator, the navigation processor 210 does not have a direct means of measuring the error in the K32 oscillator. However, while navigating, the navigation processor 210 can accurately estimate the error in the M11 signal from the GPS oscillator 302 and then use the edge aligned ratio counter 216 to transfer the GPS time from a T20 epoch to a low power clock value at a K32 tick having a known offset of a near-integral number of M11 ticks from a T20 epoch. Since GPS range measurements are made relative to T20 epochs, the T20 epochs have GPS time errors that are accurately known when navigation solutions are available from GPS measurements. Transferring the accuracy of the T20 epoch GPS time to the low power clock 306 during navigation calibrates the K32 clock signal at the current K32 oscillator 302 temperature.

Alternatively, when data for the K32 oscillator 302 in the temperature/frequency error table 224 is only partially filled out, an embodiment of the invention-employs a frequency/temperature error algorithm, such as a polynomial representation of the frequency error as a function of temperature of a typical K32 oscillator crystal 302, to approximate the temperature related frequency error of the K32 clock signal based on extrapolation or interpolation from the nearest temperature value or values having a valid table value. Such an algorithm mathematically correlates frequency errors and operating temperatures.

To conserve power, many of the GPS receiver unit 100 components, and other components of the GPS device, are shut off. During periods of time when the components are shut off to conserve power, referred to as the sleeping period or the sleep mode, the invention accurately keeps track of GPS time, as described below. Thus, when the GPS receiver unit 100 leaves the sleep mode, such as in response to a "wake-up event" or in response to another signal indicating that position is to be determined, the GPS time is accurately maintained such that a minimal amount of time is required to track the GPS satellites to determine the location of the GPS receiver unit 100.

For example, but not limited to, the local GPS oscillator 204, radio 202, local GPS clocks generator 216 and/or GPS signal processors 208 may have been powered down by the navigation processor 210 to conserve power. Powering down the selected components, when the components are not required to actively process incoming GPS satellite signals, reduces overall power consumption by the GPS receiver unit 100, thereby extending limited power source life in a portable GPS receiver unit 100. Typically, components that consume relatively large amounts of power during operation are selected for the power down. It is understood that the designer of the GPS receiver unit 100 selects the components that are to be shut off during the power down process. Since there are a great number of components residing in the GPS receiver unit 100 that may be powered down, many of which have not been described, one skilled in the art will appreciate that a detailed description and inventory of the components that may be powered down are too numerous to conveniently list and describe in detail. Any such combinations of components that are powered down in accordance with the invention are intended to be within the scope of this disclosure and to be protected by the accompanying claims.

Powering down the selected components in conventional GPS receivers results in the loss of GPS satellite signal tracking. When such conventional GPS receivers power up after loss of the GPS satellite signals, several seconds are required for the reacquisition of the GPS satellite signals and/or the establishment of GPS time of sufficient accuracy for navigation using those signals. The time required for satellite signal and time reacquisition in the conventional GPS receivers results in a corresponding power use. Therefore, the low power time keeping circuit 200 that accurately maintains GPS time during the sleeping period enables a GPS receiver unit 100 to more quickly reacquire the GPS satellite signals, thereby saving power resources.

The wake-up command is provided to the GPS receiver unit 100 on a periodic basis. The time between the periodic wake-up commands is determined based upon the specific architecture or application of the GPS receiver unit 100 in which the low powered time keeping circuit 200 has been implemented. The time between wake-up commands is selected such that the time error accumulated between the local replica PN code phase estimated by the navigation processor 210 after the power down period and incoming PN codes is less than or equal to ±0.5 ms of the actual PN code phase of the incoming GPS satellite signals. In the event that the PN code estimated by the navigation processor 210 exceeds the ±0.5 ms criteria, the navigation processor 210 initiates a conventional process to acquire GPS satellite information. Typically, the receiver 100 must estimate the likely error accumulation and choose the correct algorithm accordingly. Since the algorithm chosen may be too optimistic (using the fast acquisition rather than the conventional acquisition), the navigation processor 210 must verify the time accuracy hypothesis by comparing the resulting position and time error solution with the a priori assumed values. If the combined time and time-equivalent position errors in fact exceeded ±0.5 ms, the resulting solution will typically differ from the a priori values by recognizably large errors. If the error is not greater than ±0.5 ms, GPS time has been maintained with sufficient accuracy by the low power time keeping circuit 200.

The alarm unit 324 performs the functionality of implementing the periodic wake-up commands, also referred to as periodic navigation updates. The alarm unit 324 includes at least an alarm register 326 and a comparator 238. In one embodiment, prior to shutdown, the navigation processor 210 executes the wake-up alarm logic 222 to define the periodic times that the alarm unit 324 is to wake up the GPS receiver unit 100. In another embodiment, the time periods are predefined.

These time periods defining when the wake-up commands are issued are provided to the alarm register 326 via connection 330. In one embodiment, the time periods are defined in GPS time units (TOW and week number). In another embodiment, another suitable time period such as real time is used to define time periods.

Once the GPS receiver unit 100 is placed into a sleep mode, the alarm unit 324 monitors the K32 clock signals provided from the low power clock 306 (that is not shut down during sleep mode) to determine the current sleep mode time. The comparator 328 compares the current sleep mode time with the periodic times that the alarm unit 324 is to wake up the GPS receiver unit 100. When the current sleep mode time and the periodic times match, the alarm unit 324 generates a periodic wake-up command. This periodic wake-up command initiates a power up of the components that were powered down during the sleeping period.

In one embodiment, the periodic wake-up command initiates a power up using special purpose, dedicated hardware. For example, the wake-up command actuates one or more power switches such that the components that were powered down during the sleeping period are provided power. In another embodiment, the wake up command is provided to the navigation processor 210 such that the wake-up alarm logic 22 is executed to wake up the components that were powered down during the sleeping period.

The alarm unit 324, and its associated components, may be implemented using well-known components and techniques employed in the art of generating wake-up commands. Detailed operation of the alarm unit 324, and its associated components, are not described in detail other than to the extent necessary to understand the operation and functioning of invention. One skilled in the art will realize that the alarm unit 324, and its associated components, may be implemented using a variety of well known devices without departing substantially from the functionality and operation of the invention. Any such embodiments of the alarm unit 324, and its associated components, that are employed as a part of the invention are intended to be within the scope of this disclosure and to be protected by the accompanying claims.

As alternative embodiment may employ another suitable processor (not shown) that performs the power down and power up functions. Such a processor and its related components would not be powered down during the sleeping period. Such an alternative processor would be configured to generate the periodic wake-up command. The processor may be a component of another system (not shown in FIGS. 3 and 4) residing in the OPS receiver unit 100, or be a stand alone dedicated processor residing in the GPS receiver unit 100. Any such alternative embodiment implemented in a GPS receiver unit 100 to perform the functionality of generating periodic wake-up commands is intended to be within the scope of this disclosure and to be protected by the accompanying claims.

Also, the user may instruct the GPS receiver unit 100 to power up the components upon receiving a manually initiated wake-up command that corresponds to a positional query. For example, when the user of the GPS receiver unit 100 wants to be informed of the present location of the GPS receiver unit 100, the use initiates a manual wake-up command. A suitable means are provided for the user to query the GPS receiver unit 100. The means to manually initiate a wake-up command may be implemented using well-known components and techniques employed in the art of activating devices. Detailed operation of a means to manually initiate a wake-up command is not described in detail other than to the extent necessary to understand the operation and functioning of invention. One skilled in the art will realize that the means to manually initiate a wake-up command may be implemented using a variety of well known devices without departing substantially from the functionality and operation of the invention. Any such embodiments of the means to manually initiate a wake-up command that are employed as a part of the invention are intended to be within the scope of this disclosure and to be protected by the accompanying claims.

When the wake-up command initiates start up, the clocking signals (e.g., T20 epochs) provided by the local GPS clocks generator 216 will not be within the accuracy required to enable the GPS receiver unit 100 to perform a position update without first reacquiring satellite signals and collecting a six-second sub-frame of date to re-establish a common local GPS time frame for GPS satellite range measurements. However, if the PN code estimated by the navigation processor 210 after the end of the power down period, based upon time kept by the low power time keeping circuit 200, and incoming PN codes can be maintained to be less than or equal to ±0.5 ms of the actual PN code time of the incoming GPS satellite signals, GPS satellite signals are quickly re-acquired and measurements relative to a common local GPS time frame can be taken and used in navigation without performing the conventional process of acquiring GPS satellite signals and establishing a common time frame.

Prior to the power down, the time and rate relationships between the K32, M11 and GPS clock signals were known. By maintaining the K32 clock signal accuracy, the K32 clock signal is used by the edge aligned ratio counter 218 to latch the K32 clock signal and M11 signal, thereby recalibrating the M11 signal and the T20 epochs derived from it. Thus, the GPS oscillator 204 is recalibrated. The navigation processor 210 then sets up the matched filter or signal processor channels to acquire the PN code phases of satellites calculated to be visible. The matched filter or signal processor channel set up takes advantage of the GPS oscillator versus temperature data previously stored to compensate for frequency error in the GPS oscillator. When code phase measurements are obtained, these values are converted from a knowledge of which chip in a PN code period is currently being received to which chip in the overall GPS signal structure is being received. This conversion is made by using the assumed current GPS time and receiver position to calculate which PN chip of the overall signal structure should be arriving at the receiver and assuming the chip actually arriving is the instance of this chip in a PN code period that is closest to the one that should be arriving. If the hypothesis that the combined local GPS time estimate and the time-equivalent receiver position error is correct, the translation into the overall GPS signal structure will be correct and a consistent set of GPS range measurements will be determined. In other words, if the error of the PN code estimated by the navigation processor 210 after the end of the power down period (after leaving the sleep mode) and incoming PN codes is less than or equal to ±0.5 ms of the actual PN code time of the incoming GPS satellite signals, position information is correctly updated. The computed position and time must be compared to the a priori estimates to verify that the error was in fact less than ±0.5 ms. If the verification fails, a six-second sub-frame must be collected to establish the common time frame for measurement.

The position and time error information acquired by the GPS receiver unit 100 is then used to update the M11 and K32 clock errors. Both the GPS oscillator 204 and the K32 oscillator 302 are updated for frequency error. The K32 low power clock 306 is updated for correct GPS time. The GPS receiver unit 100 is then placed back into a sleep mode to conserve power. The above-described process is then repeated when the next wake-up command is received. This periodic updating, therefore, conserves power while maintaining the accuracy of the clock signals such that the GPS unit does not have to reacquire satellite positions using conventional processes.

Whenever the wake-up command is received, the K32 clock signal is used to update the M11 clocking signal. However, the K32 clock signal derived from the K32 oscillator 302 is subject to some error in that the K32 oscillator 302 frequency is temperature dependent, That is the K32 oscillator 302 frequency is different for different operating temperatures. In one embodiment, the temperature sensor 308 senses the operating temperature of the K32 oscillator 302. The navigation processor 210 compares the detected operating temperature of the K32 oscillator 302 with information residing in the LP clock temperature/frequency error table 322. Based upon the time between the periodic wake-up commands and the sensed operating temperature of the K32 oscillator 302, an error correction factor is determined such that the K32 time and rate are corrected to account for the operating temperature of the K32 oscillator 302. That is, the time of the K32 clock signal is corrected by the error factor to account for the actual operating temperature of the K32 oscillator 302. As described above, in one embodiment, the data in the LP clock temperature/frequency error table 322 is based upon historical data collected during actual operation, and is therefore highly accurate.

Once the K32 clock signal is recalibrated, time associated with the M11 signal is recalibrated. In one embodiment, the temperature sensor 206 senses the temperature of the GPS oscillator 206. The navigation processor 210 compares the detected operating temperature of the GPS oscillator 206 with information residing in the GPS clock temperature/frequency error table 224. Software then uses this rate correction as time progresses to scale the interval between T20 epochs based on the M11 clock to maintain the correct GPS time estimates at each epoch. Further, the initial value of GPS time at the T20 epochs just after wake-up is determined by transferring the GPS time from the K32 low power clock 306 to the M11 -based T20 epochs using the edge aligned ratio counter 216 as previously described. Since the M11 oscillator was off during the sleep period, its elapsed time cannot be scaled as the K32 low power clock 304 elapsed time was. As described above, in one embodiment, the data in the temperature/frequency error table 224 is based upon historical data collected during actual operation, and is therefore highly accurate. Then, when the K32 clock signal (now temperature corrected) is used to update the M11 clock signal (also temperature corrected), the PN code estimated by the navigation processor 210 after the power down period is less than or equal to ±0.5 ms of the actual PN code time of the incoming GPS satellite signals.

In an alternative embodiment, a wake-up event may be programmed to occur more frequently than that required for navigation updates. Such wake-up events would only serve the purpose of sampling the current temperature of the K32 oscillator. Based on the average of the temperatures of the current and prior wake-up events, the elapsed time between the two wake-up events is scaled to correct for the change in temperature. The resulting correction can be either applied to the low power clock 306 or else simply stored in a non-volatile memory until future calculations require use of the correction. Furthermore, this alternative may be upgraded to provide for a dynamic wake-up period. That is, the time between wake-up commands may be changed depending upon the particular operating conditions encountered. If the total temperature change in the K32 oscillator 302 during the power down period exceeds the predefined threshold, the time period between wake-up commands is decreased by a suitable amount of time. On the other hand, if the total temperature change is less than the predefined temperature threshold, the interval of time between wake-up commands is increased by some suitable amount of time. Thus, the power consumed to maintain an accurate temperature is minimized relative to the requirements of the current environment of temperature dynamics.

As an enhancement of the foregoing alternative, navigation processor 210 may consider the total change in operating temperature of the K32 oscillator since the last periodic wake-up command and the current periodic wake-up command. If the temperature change exceeds a predefined threshold, the navigation processor 210 may immediately initiate a navigation update process to reacquire GPS satellite signals to ensure that the integrity of the low power clock 306 is maintained within acceptable limits.

Figure 5:
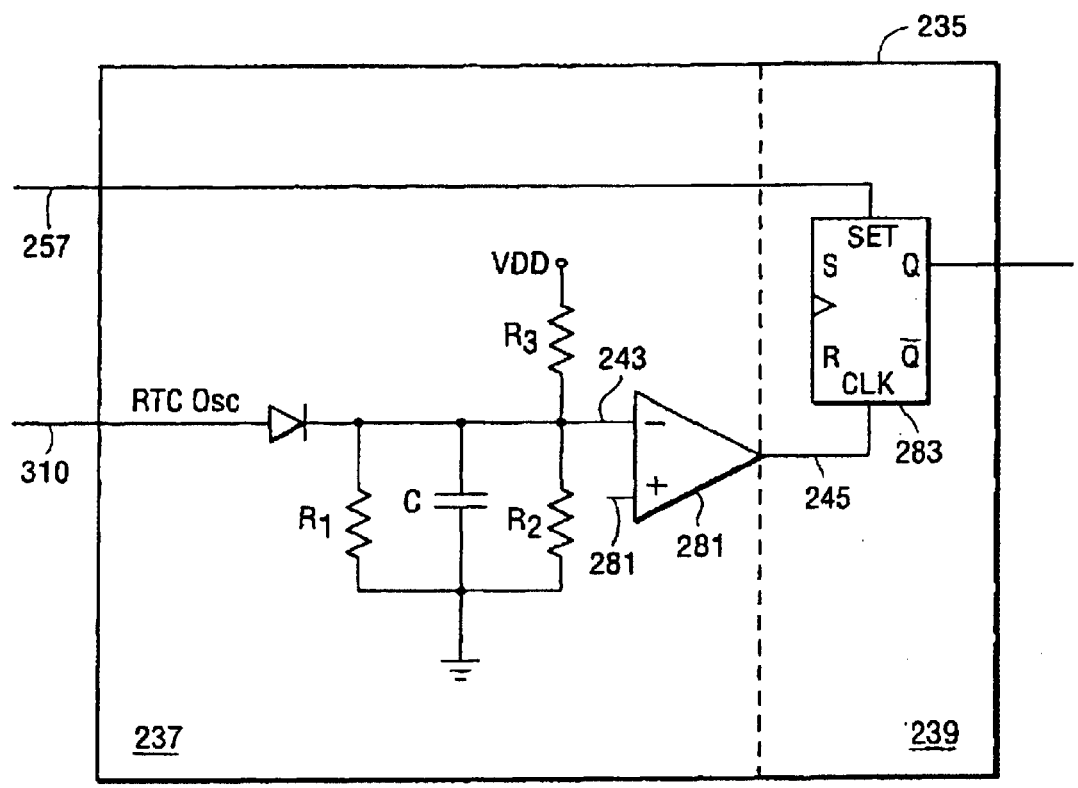
FIG. 5 is a block diagram of an embodiment of a brownout detection circuit.

FIG. 5 is a block diagram of one embodiment of the brownout detection circuit 235 according to one embodiment. The brownout detection circuit 235 includes a detection circuit 237 and a status circuit 239. The RTC clock signal is input to the detection circuit 237 on the line 310. The RTC clock signal is half-wave rectified by the diode shown. The half-wave rectified RTC clock signal is input to a resistor-capacitor (RC) circuit that includes components $R_1$, $R_2$, and the capacitor shown. An output of the RC circuit on line 241, referred to herein as the decay voltage, is one input to a voltage comparator 281.

As long as the RTC oscillator is operating, the detector 237 maintains some average DC voltage at the comparator input. The other input to the voltage comparator 281 is a reference voltage 243, which is the output of a voltage divider formed by $V_{DD}$ and resistor $R_3$. The voltage reference is sized for the lower range of battery voltage near end of life. This also ensures that the filtered, rectified clock voltage will climb above this threshold unless the clock is off for a substantial number of cycles. To accomplish this, the RC time constant is made relatively long. This makes the detection circuit 237 insensitive to exact battery voltage. The long time constant also reduces the power consumption of the circuit 237, because relatively little energy is required from the oscillator to the detector circuit 237.

The status circuit 239 includes the flip-flop 283. The flip-flop 283 indicates a low or high logic value on its output 259. As just explained, the output of the detection circuit clears the flip-flop 283 when the RTC is not good. The flip-flop 283 is set to indicate the RTC is GOOD by a signal on the set input 257.

When power is first applied, the detector circuit 237 and flip-flop 238 will respond in less time than it takes for the oscillator to power up, and thus the detected voltage at the input of the comparator 281 will exceed the threshold. Hence, the status circuit will be reset to NOT GOOD, when the battery has been removed and is replaced.

If the RTC oscillator clock stops long enough, the comparator input voltage will fall below threshold and clear the flip-flop to indicate the RTC clock is NOT GOOD.

The status flip-flop 238 is set indicate the RTC clock is GOOD by the navigation processor or other processor that has the responsibility to initially acquire GPS satellites and produce a time and position solution without being able to use the RTC time. Once the processor has produced the time and position solution, the processor sets the RTC, verifies that the RTC is correctly propagating time, and finally sets the flip-flop 238 to indicate the RTC clock is GOOD. As long as the RTC oscillator continues to operate and produce the RTC clock, the voltage will remain above threshold and the RTC status will remain GOOD.

If the RTC oscillator fails for some period, the voltage at the comparator input will gradually decay. After a sufficient number of missed clocks, the flip-flop 238 is set indicate the RTC clock is NOT GOOD. The flip-flop 238 remains in this state until the processor again reestablishes time. One of the chief objectives of the detection circuit 235 is to protect against oscillator stoppage due to battery end of life and/or temperature variations. If the issue is end of life, the backup battery is likely to remain below the threshold required for oscillation. If the issue is temperature, the time constants associated with temperature are relatively slow. Furthermore, once the oscillator has stopped due to the battery experiencing low temperature, the oscillator will likely require a higher voltage to restart than the voltage (and current) being supplied when it stopped. Hence, a time constant that requires even thousands of cycles is acceptable.

The detection circuit 235 can be written to and read from in various manners in different embodiments. For example, in some embodiments, the detection circuit 235 resides on the RF chip 103, and in other embodiments resides on the baseband chip 105. The output 259 of the status circuit 239 may be read using a command according to a bus or interface protocol, or may be directly monitored. Similarly, the set input 257 of the status circuit 239 may be toggled by any software or hardware mechanism according to the specific architecture of an embodiment.

For example, a microprocessor bus interface may read and write the flip-flop 283. In this situation, reading the flip-flop 283 may require the peripheral bus strobe to be active, the write line to be inactive, the peripheral select decode to activate an appropriate select signal, and a local RTC block decode to assert a "RTC_GOOD" signal. Reading and writing the flip-flop 283 according to a bus protocol is contemplated, for example, when the brownout detection circuit resides on the baseband chip.

In another embodiment, the RTC oscillator and the brownout detector circuit 235 reside on the RF chip. This allows a quieter environment for the oscillator, enhancing the ability to accurately calibrate the RTC oscillator and to locate this oscillator closer to the temperature sensor for calibration purposes. In this case, the interface to the flip-flop 283 would be different. For example, a message decode from a serial IO port would select the flip-flop 283 for reading and latch this bit into a message, subsequently clocked out over the port to a processor on the baseband chip.

Many circuit variations are within the scope of the disclosed brownout detection circuit. The particular circuit components shown are but one embodiment to perform the desired function. Many other circuits are possible and practical for particular environments. For example, the capacitor in the detector circuit must be very small for mixed signal integration. Thus, the simple RC time constant may be replaced by some additional electronics to amplify the effective capacitance. Similarly, the asynchronous set interface to the flip-flop 283 may actually be a synchronous set interface from a processor bus. These are known circuit techniques that enhance the concept by reducing circuit size or power consumption.

Figure 6:
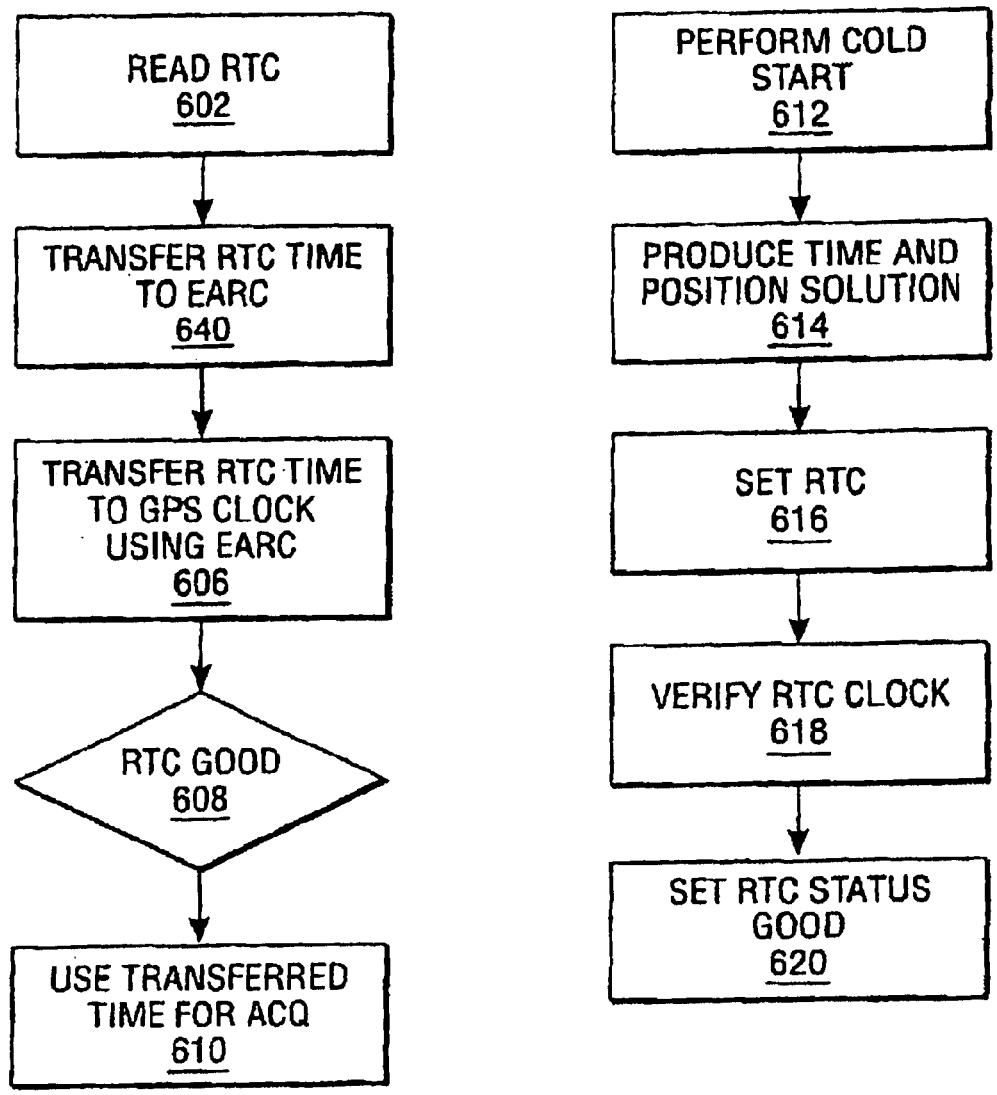
FIG. 6 is a flow diagram illustrating a brownout detection process of one embodiment.

FIG. 6 is a flow chart showing the operation of the brownout detection circuit 235 according to an embodiment. At start-up of the GPS receiver 100, as shown at 602, the navigation processor 210 reads the RTC at 602. This RTC time is transferred to the EARC at 604. At 608, the status of the RTC is checked by reading the output 259 of the detector 235. If the RTC is GOOD, the navigation processor proceeds to use the transferred RTC time to begin acquisition at 610. If the RTC is NOT GOOD, one course of action is for the navigation processor 210 to proceed with a cold start at 612. At 614, the navigation processor 210 produces a time and position solution. With the time solution, the navigation processor 210 set the RTC at 616. The navigation processor 210 verifies that the RTC clock is running at 618. If the RTC clock is verified, the navigation processor 210 sets the RTC status GOOD at 620 by sending a signal to the status circuit 239. If the RTC clock is not verified, the navigation processor 210 again attempts to verify that the RTC clock is running at 618.

Figure 7B:
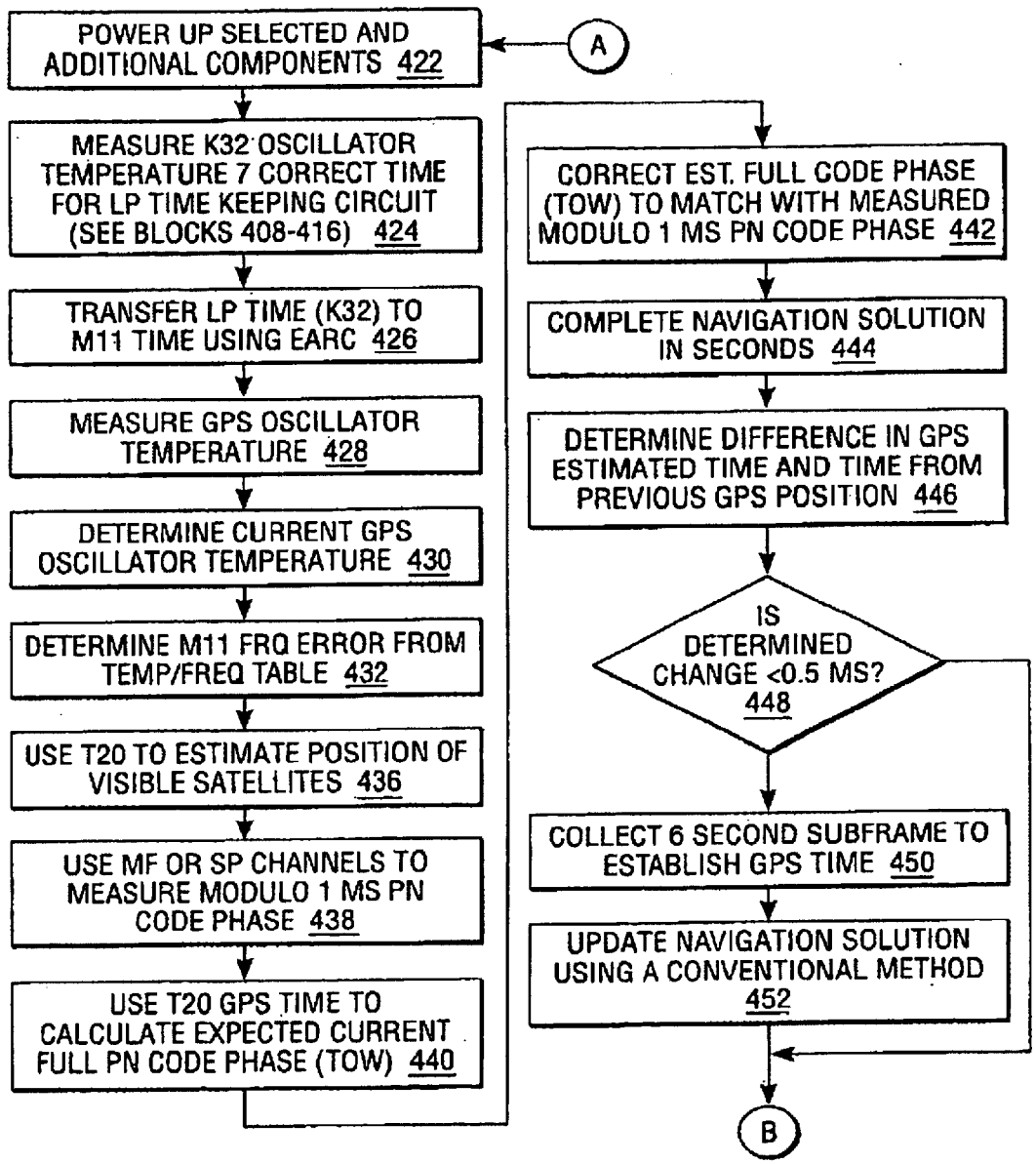
Figure 7C:
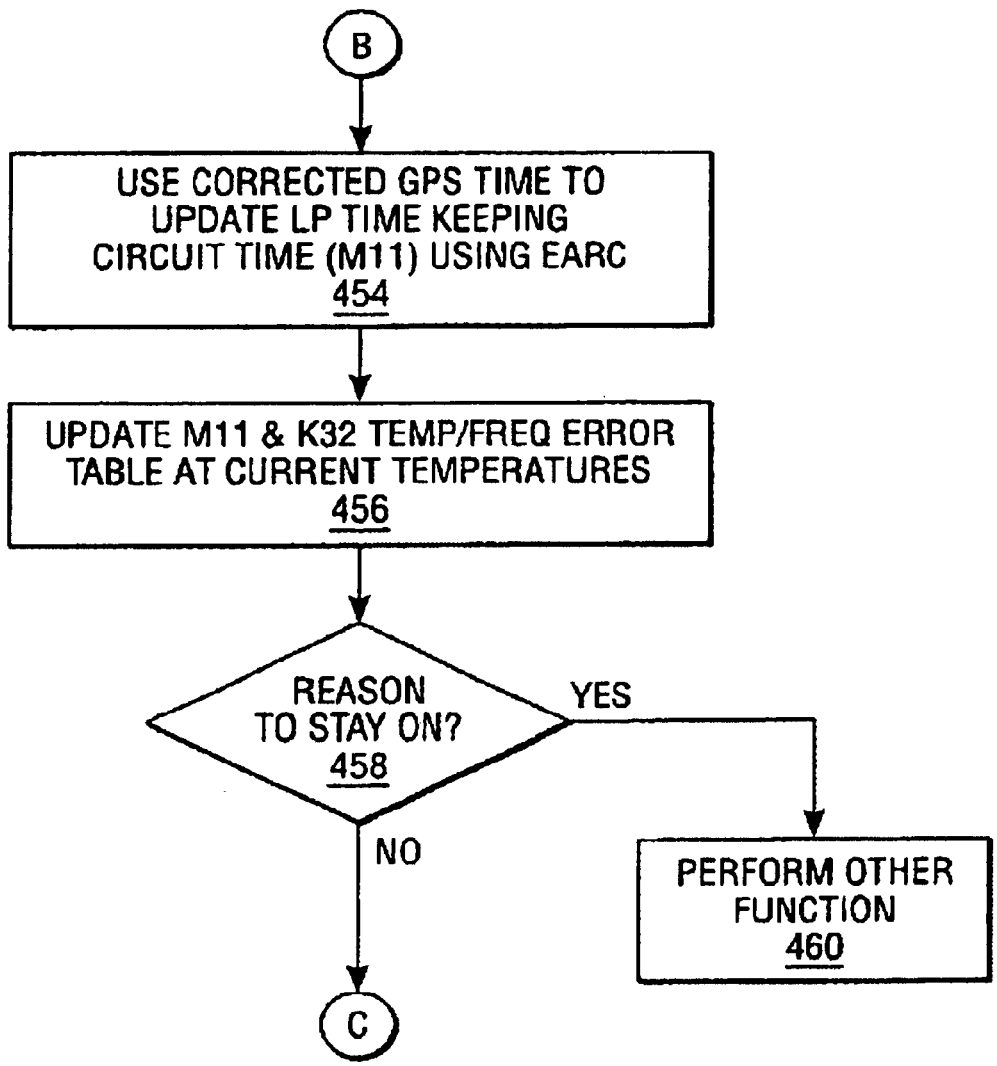

The brownout detection process illustrated in FIG. 6 is one embodiment of a process that is performed along with other processes described herein. For example, FIGS. 7A, 7B and 7C illustrate an embodiment of a process that is contemplated to be performed with the process of FIG. 6. Referring now to FIGS. 7A, 7B and 7C, flow chart 400 illustrates an embodiment of a process that includes using the K32 clock signal to update the M11 clock signal. The process of flow chart 400 further includes determining whether or not the estimated GPS time is sufficiently accurate to acquire position of the GPS receiver unit 100. If the time error between the PN code estimated by the navigation processor 210 during the power down period and incoming PN codes is less than or equal to ±0.5 ms of the actual PN code time of the incoming GPS satellite signals, the K32 clock signal and the M11 clock signal are updated. The process of flow chart 400 further includes updating the M11 clock signal associated with the GPS oscillator 204 and the K32 clock signal associated with the K32 oscillator 302 with detected GPS satellite information. After the update, the GPS receiver unit 100 then returns to a sleep, or powered down, mode.

The flow chart 400 further illustrates an embodiment of the wake-up alarm logic 222. In some alternative implementations, the functions described may occur out of the order noted in the flow chart 400, the functions described may occur concurrently, some of the functions described may be eliminated, or additional functions may be included.

The process begins at block 402 when a wake-up command is generated by the alarm unit 324. Alternatively, the process may also begin when a user queries the GPS receiver unit 100 to provide position information (a "navigation update").

At block 404, a determination is made whether the reason for the power-up was a wake-up command or a position query from the user. If the reason for the power-up was the generation of the wake-up command by the alarm unit 324 such that the GPS receiver unit 100 is to update the K32 based time maintained by the low power timekeeping circuit 200, then the process proceeds to block 406. However, if the reason for the power-up is to provide location information in response to a position query from the user, the GPS receiver unit 100 initiates a navigation update by proceeding to block 422.

At block 406, selected components that are employed in the recalibration of the K32 clocking signals as described below, are powered up. Other components of the GPS receiver unit 100 are not powered up at block 406 to conserve power. For example, the OPS receiver unit 100 may include a display (not shown) that indicates to the user at least determined position information. If the GPS receiver unit 100 is performing a periodic navigation update, the user may not be interested in either knowing that the device is performing a navigation update or in knowing the position information. Thus, the display (not shown) is not powered up at block 406, thereby conserving power.

At block 408, temperature sensor 308 measures the temperature of the K32 oscillator 302. At block 410, an average temperature is determined for the K32 oscillator 302 during the time that the GPS receiver unit 100 was in the sleep mode. At block 412, the K32 based time maintained by the low power time keeping circuit 200 is accessed. Based upon a time error at block 414, based upon information in the temperature/frequency error table 224, a correction factor as described above is applied to the K32 based time determined. This correction factor is then used to correct the K32 based time maintained by the low power time keeping circuit 200 at block 416.

In one embodiment, the time for the next wake-up command is determined at block 418. Accordingly, the wake-up time is updated in the alarm register 326. Alternatively, other embodiments employ a predefined time interval between the periodic wake-up commands and/or provide periodic wake-up commands from other components.

At block 420, the selected powered-up components (at block 406) are powered down. Since the K32 based time maintained by the low power time keeping circuit 200 has been updated, these selected components are powered down to conserve power resources. The process proceeds back to block 402 to await the next wake-up command or a position query from the user.

If a position query is received block 404, the GPS receiver unit 100 understands that it is to accurately determine the location of the GPS receiver unit 100 and to indicate the location to the user, and the process proceeds to block 422. That is, the user desires a navigation update.

Accordingly, components of the GPS receiver unit 100 described below are poweredup at block 422. Components associated with the updating of the M11 based time are powered-up at block 422. For example, the radio 202, the GPS oscillator 204, the temperature sensor 206, the navigation processor 210, the match filter 212, the A/D converter 214, the local GPS clocks generator 216, the edge aligned ratio counter 218 and/or the memory 220 are repowered.

Furthermore, the GPS receiver unit 100 may include additional components, not associated with the updating of the M11 based time, that are powered-up at block 422. For example, a display (not shown) and associated circuitry may be used to indicate to the user the determined position information. Thus, the display must be powered-up. In contrast, the display did not need to be powered-up at block 406 because the location information was not displayed during the update of the K32 based time as described above (blocks 406-416). In one embodiment, these additional components are powered up concurrently with the above described components at block 406.

In another embodiment, the powering up of these additional components is delayed until the navigational update is completed. Accordingly, block 422 would be shown as two separate blocks, with the powering up of the additional components shown with a new block inserted at a later point in the flow chart 400. After the GPS receiver unit 100 has determined an updated position, these additional selected components are powered up such that the updated position is indicated to the user. For example, the GPS receiver unit 100 may include a display (not shown) and associated circuitry that indicates to the user at least determined position information. Such an alternative embodiment delaying repowering of these additional selected components only when a position update is requested is particularly advantageous for conserving power. That is, if the selected additional components are not required for the recalibration of the clocks and the associated navigation update, maintaining the selected components in a sleep mode when a wake-up command is received further conserves power.

At block 424, temperature sensor 308 measures the temperature of the K32 oscillator 302 and corrects the K32 based time maintained by the low power time keeping circuit 200 by correcting the time using a correction factor determined from the temperature/frequency error table 224 using the process described above in blocks 408-416. That is, the K32 based time is corrected for any temperature/frequency deviations occurring during the sleeping period.

At block 426, the updated. K32 based time is transferred to the M11 based time by the edge line ratio counter 216. Thus, the GPS receiver unit 100 has powered up its components and used the corrected K32 based time from the low power time keeping circuit 200 to accurately update GPS time from the M11 clocking signal provided by the GPS oscillator 204. However, in one embodiment, error in the M11 clocking signal may have occurred due to temperature changes of the GPS oscillator 204. Accordingly, at block 428, temperature sensor 206 measures the temperature of the GPS oscillator 204. At block 430, the current GPS oscillator 204 temperature is determined. At block 432, the M11 frequency error is determined from the temperature/frequency table.

At block 436, the updated T20 epoch is used to estimate the position and the Dopplers of the visible GPS satellites 102, 104, 106 and/or 108. Based upon the estimated position of the visible satellites 102, 104, 106 and/or 108, the GPS receiver unit 100 employs the matched filter 212 or the GPS signal processors 208 to measure the PN code phase (modulo 1 ms) for the visible satellites 102, 104, 106 and/or 108 at block 438. Then, at block 440, the estimated T20 epoch is used to calculate the expected current full PN code phase, as a time of week (TOW), for each of the satellites 102, 104, 106 and/or 108. That is, the GPS receiver unit 100 has used the updated M11 clocking signal from the GPS oscillator 204 to accurately estimate a modulo 1 ms PN code phase to calculate an expected complete PN code phase as a time of week.

At block 443 the full code phase is corrected to match the measured PN code phase (modulo 1 ms). At block 444 the navigation solution is computed based upon the estimated corrected full PN code phase. Next, at block 446, the computed navigation solution is compared with the previous navigation solution in units of time.

At block 448, a determination is made whether the calculated position of the GPS receiver unit 100 has changed by less than ±0.5 ms (less than 1 PN code) from the previous navigation solution time. If the determined change is greater than ±0.5 ms (the NO condition) the process proceeds to block 450 such that the GPS receiver unit 100 collects an entire 6 second sub-frame from each of the GPS satellites 102, 104, 106 and/or 108 to establish GPS time. At block 452, the GPS receiver unit 100 employs a conventional method to update the navigation solution, thereby accurately determining the position of the GPS receiver unit 100.

However, if at block 448 the change in position is determined to be less than or equal to ±0.5 ms (the YES condition) the GPS receiver unit 100 has accurately maintained GPS time with the low power timekeeping circuit 200. Accordingly, the process proceeds to block 454 such that the corrected T20 time is used to update the low power time keeping circuit 200 M11 time using the edge aligned ratio counter 218 in a manner described above. Thus, the K32 clocking signal is correlated with the accurately determined GPS T20 time in preparation for the next power down period.

In one embodiment, the data residing in the temperature/frequency error table 224 is updated with the temperature and frequency information collected above. That is, this embodiment employs acquired temperature and frequency data to continuously update the temperature/frequency error table 224 data, thereby improving the accuracy of subsequent correction factors determined from the temperature/frequency error table 224.

At block 458, a determination is made whether or not the GPS receiver unit 100 is to stay on. If the GPS receiver unit 100 is to stay on (the YES condition), the process proceeds to block 460 such that the GPS receiver unit 100 performs other functions. Such other functions are not described in detail herein as such functions may not necessarily be related to accurately maintaining time during power down periods. After these other functions have been performed, the process proceeds back to block 418 such that the next time of the wake-up command is determined as described above.

If at block 458 a determination is made that there is no reason for the GPS receiver unit 100 to stay on (the NO condition), the process proceeds directly to block 418. That is, the process proceeds to block 418 such that the GPS receiver unit 100 is powered down to conserve energy while the low power time keeping circuit 200 accurately maintains GPS time.

The above described embodiments of a GPS receiver unit 100 are generally described as updating the K32 clock signal derived from the K32 oscillator 302 and the M11 clocking signal derived from the GPS oscillator 204 such that accurate GPS time is maintained during periods when the GPS oscillator 204 is powered down. Other embodiments update a variety of other clocking signals associated with the determination of location from GPS satellites. Furthermore, the GPS oscillator 204 was described as providing a signal having an oscillation frequency substantially equal to 11 MHz. Similarly, the K32 oscillator 302 was described as generating a signal having a frequency of oscillation substantially equal to 32 kHz. Other embodiments of GPS receiver units may be implemented with a GPS oscillator and/or an oscillator residing in the low power time keeping circuit that have frequencies of oscillation different from the oscillation frequencies of the GPS oscillator 204 and the K32 oscillator 302. Furthermore, the low power time keeping circuit was described as providing a clocking signal substantially at 32 kHz that was used for maintaining the GPS time accuracy during the periods of time that the components were powered off. The clocking signals provided from the low power time keeping circuit 200, in other embodiments, are used to provide clocking signals to other components residing in a GPS receiver unit. However, such components are not described in detail other than to the extent necessary to understand the operation and functionality of the invention.

In an alternative embodiment, temperature sensors 206 and 308 are replaced by, or incorporated into, a single temperature sensor suitably located so that the operating temperatures of the GPS oscillator 204 and the K32 oscillator 302 are detected. Such a temperature sensor may be further configured to provide a signal directly to the navigation processor 210. This embodiment reduces the number of components, and may provide a corresponding decrease in costs, size and power consumption.

For convenience of illustration in FIGS. 3 and 4, and for convenience of explaining the operation and functionality of the invention, processing the sensed temperatures and calculating the total frequency error in the signal from the K32 oscillator 302, and the GPS oscillator 204, was described and shown as being implemented by the execution of logic by the navigation processor 210, such logic residing as a portion of the wake-up alarm logic 222. Alternatively, the processing could be implemented by a different processor. Furthermore, the logic for processing sensed temperatures and logic for calculating the total frequency error in the signal from the K32 oscillator 302 could reside in dedicated logic modules (not shown) residing in memory 220, or in another suitable memory. Additionally, the LP clock temperature/frequency error table 322 and/or the GPS clock temperature/frequency error table 224 was shown as residing in memory 220 for convenience. Sensed temperatures table 508 could reside in an alternative location and/or in a suitable alternative storage medium. Any such alternative implementations are intended to be within the scope of this disclosure and to be protected by the accompanying claims.

While various embodiments of the invention have been described, various modifications available to those of ordinary skill in the art are within the scope of this invention, which is defined by the claims.

What is claimed is:

1. A global positioning system (GPS) receiver system, comprising:

a GPS clock that is calibrated to GPS time when the GPS receiver system is navigating using GPS satellite data, wherein the GPS clock is configured to be turned off when the GPS receiver system is not navigating;

a real time clock (RTC) that uses significantly less power than the GPS clock, wherein the RTC is configured to keep time when the GPS clock is turned off;

a brownout detection circuit coupled to the RTC, wherein the brownout detection circuit is configured to,
receive an RTC clock signal;
detect a loss of RTC clock cycles; and
output an RTC status signal that indicates a loss of RTC clock cycles above a predetermined threshold.

2. The GPS receiver system of claim 1, wherein the brownout detection circuit comprises:
   a detection circuit that receives the RTC clock signal and determines whether the RTC clock is losing cycles, wherein the detection circuit is calibrated to determine whether a loss of cycles is above the predetermined threshold; and
   a status circuit that stores a signal output by the detection circuit and outputs a status signal indicating the RTC clock is one of GOOD and NOT GOOD.

3. The GPS receiver system of claim 2, wherein the detection circuit comprises a resistor-capacitor (RC) time constant component with a predetermined time constant, wherein the RC time constant component receives the RTC clock signal and outputs a decayed voltage, wherein a level of the decayed voltage indicates whether the loss of cycles is above the predetermined threshold.

4. The GPS receiver of claim 3, further comprising a navigation processor coupled to receive the status signal, wherein the navigation processor determines whether to use the RTC clock for acquisition of satellites based on the status signal.

5. The GPS receiver system of claim 4, further comprising an edge aligned ratio counter (EARC) coupled to the RTC and to the GPS clock, wherein, on startup of the GPS receiver system for satellite acquisition, time kept by the RTC clock is transferred to the GS clock using the EARC, and wherein the transferred RTC time is used for acquisition if the status signal indicates the RTC is GOOD.

6. A system for global positioning system (GPS) navigation comprising:
   a baseband chip; and
   a radio frequency (RF) chip, wherein the RF chip and the baseband chip are coupled through an interface, and wherein the RF chip comprises:
   a GPS clock that is calibrated to GPS time when the GPS receiver system is navigating using GPS satellite data, wherein the GPS clock is configured to be turned off when the GPS receiver system is not navigating;
   a real time clock (RTC) that uses significantly less power than the GPS clock, wherein the RTC is configured to keep time when the GPS clock is turned off; and
   a brownout detection circuit coupled to the RTC, wherein the brownout detection circuit is configured to detect a loss of RTC clock cycles.

7. The system of claim 6, wherein the RF chip further comprises:
   a temperature sensor coupled to the RTC; and
   an analog to digital (A/D) converter coupled to the temperature sensor.

8. The system of claim 7, wherein the baseband chip comprises:
   a navigation processor coupled to receive signals from the RF chip through the interface, including an RTC status signal that indicates whether the RTC clock signal should be used for satellite acquisition;
   an edge aligned ratio counter (EARC) coupled to receive a GPS clock signal and the RTC clock signal and configured to align respective GPS and RTC clock signals with a high degree of accuracy, and to transfer time kept by the RTC clock to the GPS clock; and
   a memory device coupled to the A/D converter and to the RTC, and configured to store a table relating temperature to frequency for the RTC clock.

9. The system of claim 7, wherein the brownout detection circuit comprises:
   a detection circuit that receives the RTC clock signal and determines whether the RTC clock is losing cycles, wherein the detection circuit is calibrated to determine whether a loss of cycles is above the predetermined threshold; and
   a status circuit that stores a signal output by the detection circuit and outputs a status signal indicating the RTC clock is one of GOOD and NOT GOOD.

10. The system of claim 9, wherein the detection circuit comprises a resistor-capacitor (RC) time constant component with a predetermined time constant, wherein the RC time constant component receives the RTC clock signal and outputs a decayed voltage, wherein a level of the decayed voltage indicates whether the loss of cycles is above the predetermined threshold.

11. The system of claim 7, wherein the interface comprises a serial peripheral interface.

12. The system of claim 8, wherein the navigation processor sends a command via the interface to the brownout detection circuit requesting a status of the RTC, and wherein the brownout detection circuit responds by sending an RTC status via the interface.

13. A system for global positioning system (GPS) navigation comprising:
   a radio frequency (RF) chip, wherein the RF chip comprises a GPS clock that is calibrated to GPS time when the OPS receiver system is navigating using GPS satellite data, wherein the GPS clock is configured to be turned off when the GPS receiver system is not navigating; and
   a baseband chip, wherein the baseband chip and the RF chip are coupled through a system interface, and wherein the baseband chip comprises,
   a real time clock (RTC) that uses significantly less power than the GPS clock, wherein the RTC is configured to keep time when the GPS clock is turned off; and
   a brownout detection circuit coupled to the RTC, wherein the brownout detection circuit is configured to detect a loss of RTC clock cycles.

14. The system of claim 13, wherein the baseband chip further comprises:
   a temperature sensor coupled to the RTC; and
   an analog to digital (A/D) converter coupled to the temperature sensor.

15. The system of claim 14, wherein the baseband chip further comprises an edge aligned ratio counter (EARC) coupled to receive a GPS clock signal and the RTC clock signal and configured to align the respective clock signals with a high degree of accuracy, and to transfer time kept by the RTC clock to the GPS clock.

16. The system of claim 15, wherein the baseband chip is coupled to a processor and a memory through a peripheral interface, wherein:
   the memory device is coupled to the A/D/converter and to the RTC, and is configured to store a table relating temperature to frequency for the RTC clock; and
   the processor is configured to receive signals through the peripheral interface, including an RTC status signal that indicates whether the RTC clock signal should be used for satellite acquisition.

17. The system of claim 13, wherein the brownout detection circuit comprises:
   a detection circuit that receives the RTC clock signal and determines whether the RTC clock is losing cycles, wherein the detection circuit is calibrated to determine whether a loss of cycles is above the predetermined threshold; and a status circuit that stores a signal output by the detection circuit and outputs a status signal indicating the RTC clock is one of GOOD and NOT GOOD.

18. The system of claim 17, wherein the detection circuit comprises a resistor-capacitor (RC) time constant component with a predetermined time constant, wherein the RC time constant component receives the RTC clock signal and outputs a decayed voltage, wherein a level of the decayed voltage indicates whether the loss of cycles is above the predetermined threshold.

19. The system of claim 13, wherein the system interface comprises a serial peripheral interface.

20. The system of claim 16, wherein the processor sends a command via the peripheral interface to the brownout detection circuit requesting a status of the RTC, and wherein the brownout detection circuit responds by sending an RTC status signal via the peripheral interface.

21. An apparatus for detecting a loss of clock cycles in a clock signal generating device, the apparatus comprising:

a detection circuit that receives a clock signal from the clock signal generating device, and determines whether the clock signal generating device is losing cycles, wherein the detection circuit is calibrated to determine whether a loss of cycles is above the predetermined threshold, and a status circuit that stores a signal output by the detection circuit and outputs a status signal indicating the clock signal generating device is one of GOOD and NOT GOOD.

22. The apparatus of claim 21, wherein the detection circuit comprises a resistor-capacitor (RC) time constant component with a predetermined time constant, wherein the RC time constant component receives the clock signal and outputs a decayed voltage, wherein a level of the decayed voltage indicates whether the loss of cycles is above the predetermined threshold.

23. The apparatus of claim 22, wherein:

the status circuit comprises a latch device; and the detection circuit further comprises a voltage comparator coupled to latch device, wherein the voltage comparator compares the decayed voltage and a reference voltage and outputs a result signal that resets the latch when the loss of cycles is above the predetermined threshold.

24. A method of determining a status of a real time clock (RTC) in a global positioning system (GPS) receiver, the method comprising:

receiving an RTC clock signal in a detection circuit;

detecting when the RTC is losing clock signals such that the loss of clock cycles is above a predetermined threshold;

storing the status of the RTC, wherein the status is one of GOOD and NOT GOOD;

if the loss of clock cycles is above the predetermined threshold, setting the status of the RTC to bad; and before using the RTC clock signal for acquiring satellites, checking the status of the RTC.

25. The method of claim 24, wherein detecting comprises receiving the RTC clock signal in a resistor-capacitor (RC) circuit with a calculated RC time constant such that when the loss of clock cycles is above the predetermined threshold, an output voltage of the RC circuit decays below a predetermined level.

26. The method of claim 25, wherein storing the status comprises storing a status bit based on the output voltage level of the RC circuit, wherein a first logic value of the status bit indicates GOOD and a second logic value of the status bit indicates "bad.

27. The method of claim 26, further comprising, on start-up of the GPS receiver, setting the status bit to indicate GOOD during an interval when the RTC is powering up.

28. The method of claim 27, further comprising:

on start-up of the GPS receiver, transferring time kept by the RTC to a GPS clock using an edge aligned ratio counter (EARC);

checking the status of the RTC; and if the status of the RTC is GOOD, using the transferred time to acquire satellites.

* * * * *